(12) United States Patent
Anderson et al.

(10) Patent No.: US 10,573,727 B2
(45) Date of Patent: Feb. 25, 2020

(54) VERTICAL TRANSISTOR DEVICE

(71) Applicant: International Business Machines Corporation, Armonk, NY (US)

(72) Inventors: Brent A. Anderson, Jericho, VT (US); Huiming Bu, Glenmont, NY (US); Fee Li Lie, Albany, NY (US); Shogo Mochizuki, Clifton Park, NY (US); Junli Wang, Slingerlands, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/284,563

(22) Filed: Oct. 4, 2016

(65) Prior Publication Data
US 2017/0229556 A1  Aug. 10, 2017

Related U.S. Application Data

(62) Division of application No. 15/017,868, filed on Feb. 8, 2016, now Pat. No. 10,141,426.

(51) Int. Cl.
| | |
|---|---|
| *H01L 29/66* | (2006.01) |
| *H01L 21/306* | (2006.01) |
| *H01L 21/324* | (2006.01) |
| *H01L 21/308* | (2006.01) |
| *H01L 29/417* | (2006.01) |

(Continued)

(52) U.S. Cl.
CPC .... *H01L 29/66795* (2013.01); *H01L 21/2254* (2013.01); *H01L 21/308* (2013.01);
(Continued)

(58) Field of Classification Search
CPC ........... H01L 29/66666; H01L 21/2254; H01L 21/3065; H01L 21/308; H01L 21/324; H01L 29/42392; H01L 29/78618
(Continued)

(56) References Cited

U.S. PATENT DOCUMENTS

| | | | | |
|---|---|---|---|---|
| 6,071,783 A | * | 6/2000 | Liang | .................. H01L 29/0653 257/E21.431 |
| 7,528,453 B2 | * | 5/2009 | Holz | .................... H01L 29/0653 257/374 |

(Continued)

OTHER PUBLICATIONS

List of IBM Patents or Patent Applications Treated as Related; (Appendix P), Filed Jan. 18, 2018; 2 pages.

*Primary Examiner* — Ori Nadav
(74) *Attorney, Agent, or Firm* — Cantor Colburn LLP; Vazken Alexanian

(57) ABSTRACT

According to an embodiment of the present invention, a method for forming a semiconductor device includes patterning a first fin in a semiconductor substrate, and forming a liner layer over the first fin. The method further includes removing a first portion of the liner layer, and removing a portion of the exposed semiconductor substrate to form a first cavity. The method also includes performing an isotropic etching process to remove portions of the semiconductor substrate in the first cavity and form a first undercut region below the liner layer, growing a first epitaxial semiconductor material in the first undercut region and the first cavity, and performing a first annealing process to drive dopants from the first epitaxial semiconductor material into the first fin to form a first source/drain layer under the first fin and in portions of the semiconductor substrate.

20 Claims, 26 Drawing Sheets

(51) Int. Cl.
    *H01L 29/78*      (2006.01)
    *H01L 21/225*     (2006.01)
    *H01L 21/3065*    (2006.01)
    *H01L 29/423*     (2006.01)
    *H01L 29/786*     (2006.01)

(52) U.S. Cl.
    CPC ...... *H01L 21/3065* (2013.01); *H01L 21/3085* (2013.01); *H01L 21/30604* (2013.01); *H01L 21/324* (2013.01); *H01L 29/41791* (2013.01); *H01L 29/42392* (2013.01); *H01L 29/66666* (2013.01); *H01L 29/785* (2013.01); *H01L 29/78618* (2013.01); *H01L 29/78642* (2013.01); *H01L 29/78696* (2013.01); *H01L 29/66553* (2013.01)

(58) Field of Classification Search
    USPC .......................................................... 257/401
    See application file for complete search history.

(56) References Cited

U.S. PATENT DOCUMENTS

| | | | |
|---|---|---|---|
| 7,683,428 B2 * | 3/2010 | Chidambarrao | H01L 29/66787 257/302 |
| 8,664,056 B2 * | 3/2014 | Wirbeleit | H01L 21/26506 438/198 |
| 2012/0319203 A1 * | 12/2012 | Cheng | H01L 29/66666 257/346 |
| 2017/0229556 A1 | 8/2017 | Anderson et al. | |
| 2017/0229558 A1 | 8/2017 | Anderson et al. | |

\* cited by examiner

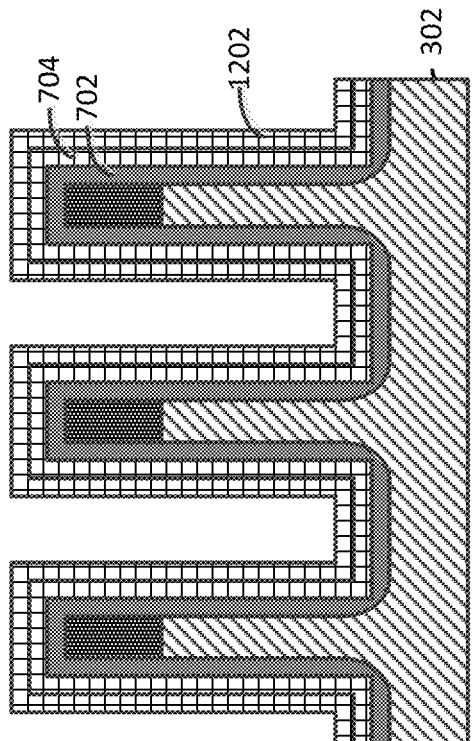
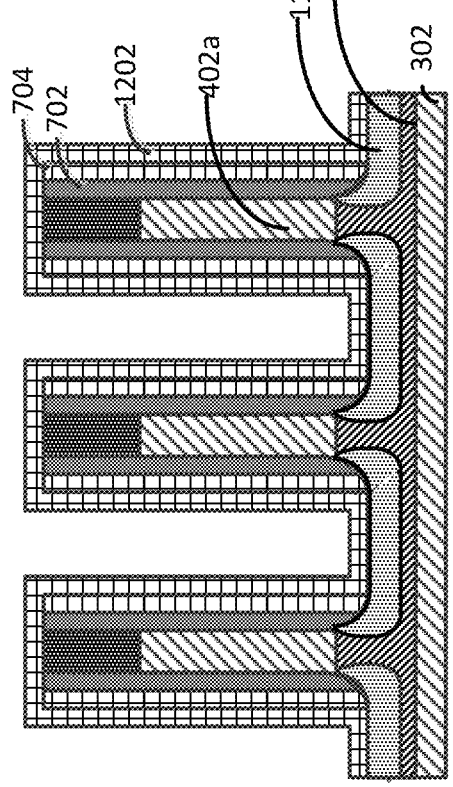
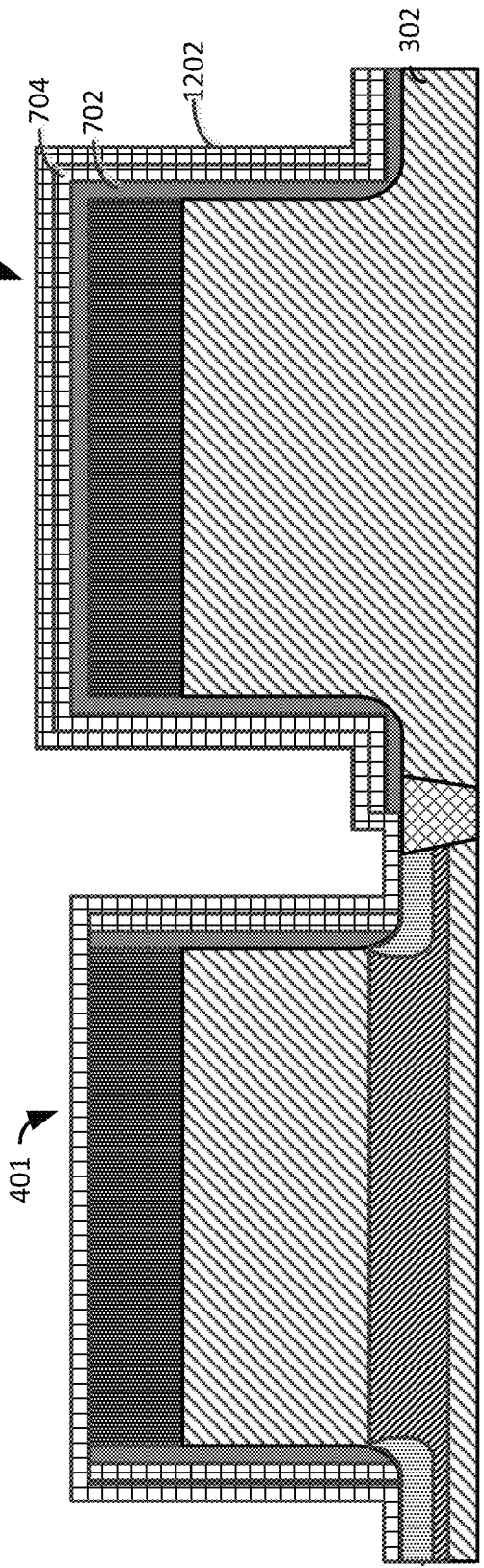
FIG. 12A
FIG. 12B
FIG. 12C

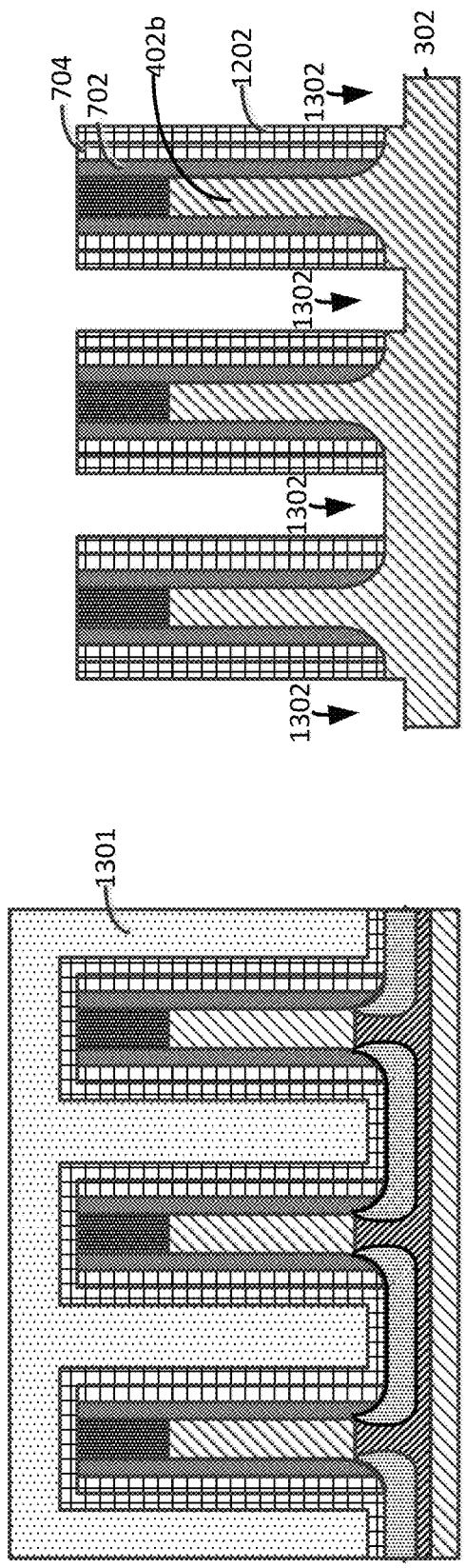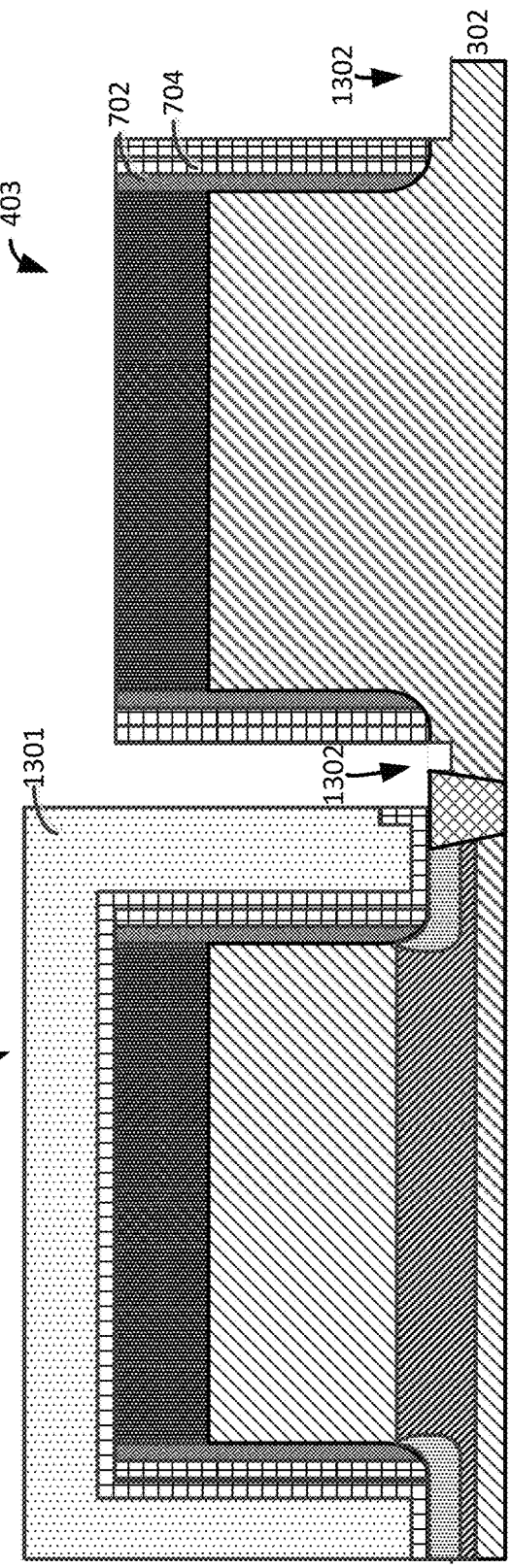
FIG. 13A
FIG. 13B
FIG. 13C

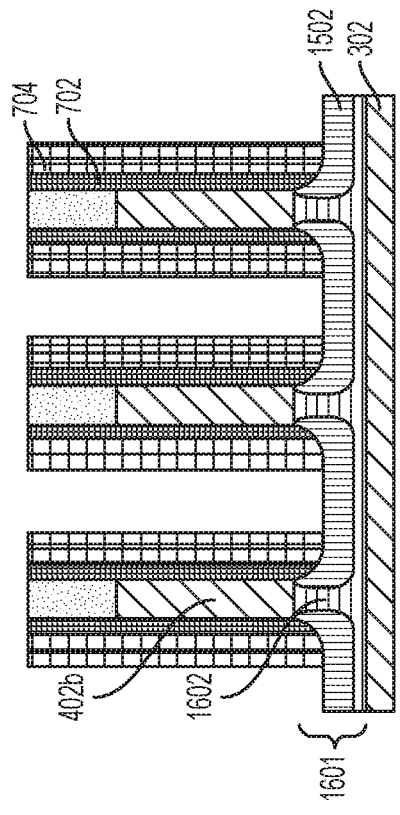
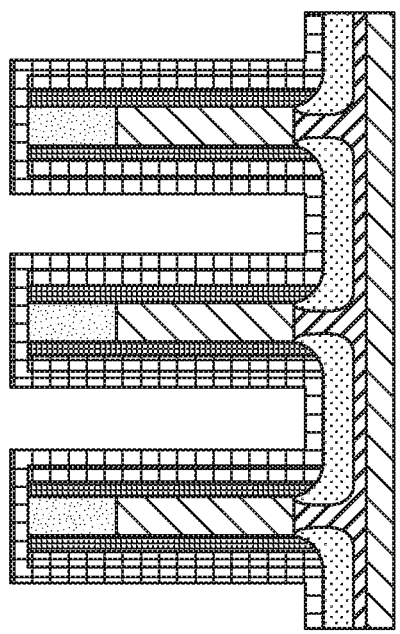
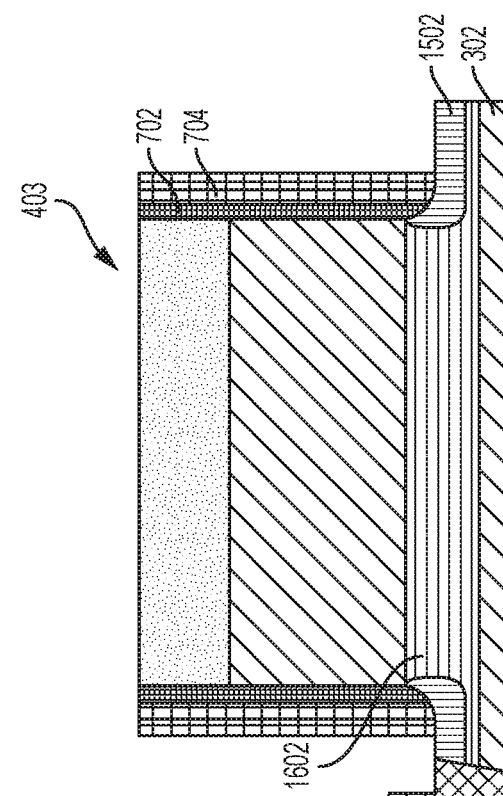
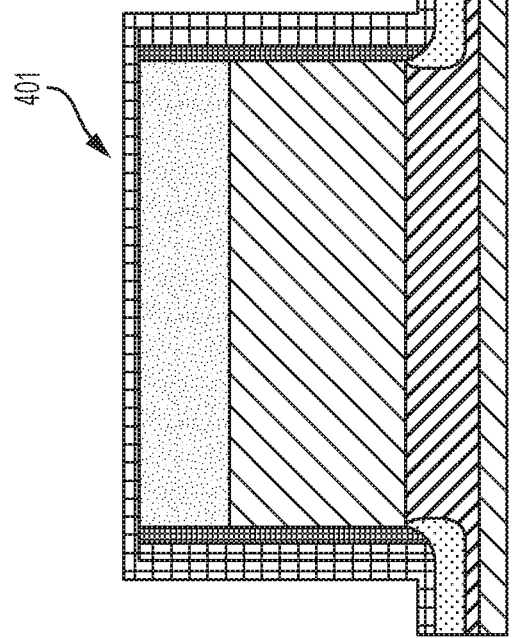
FIG. 16A  FIG. 16B  FIG. 16C

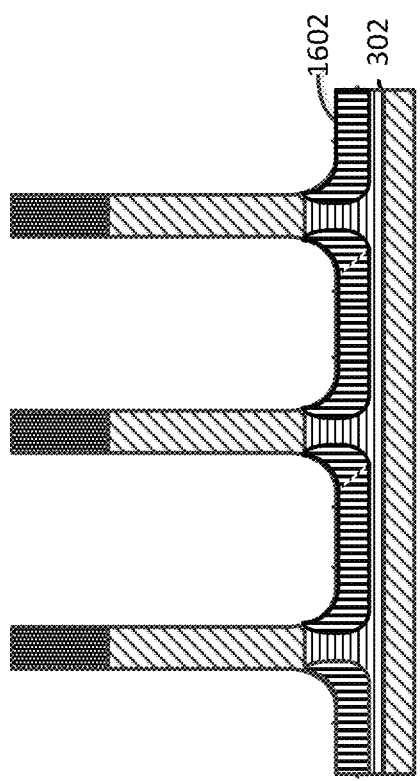
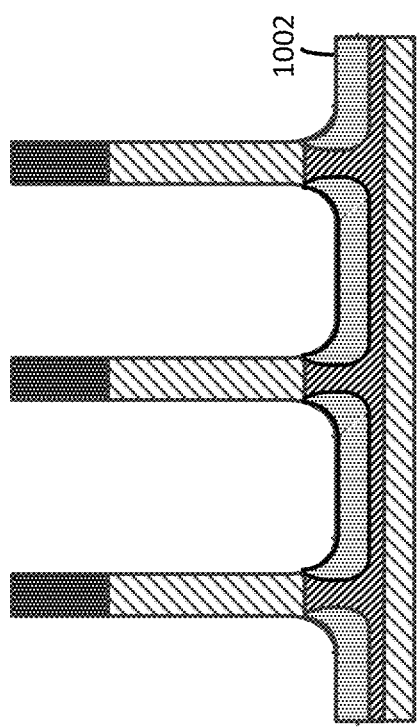
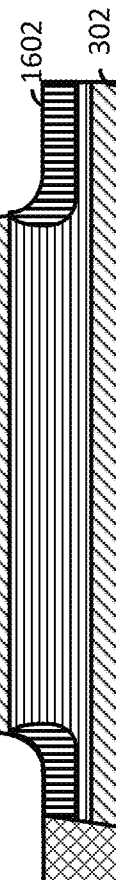
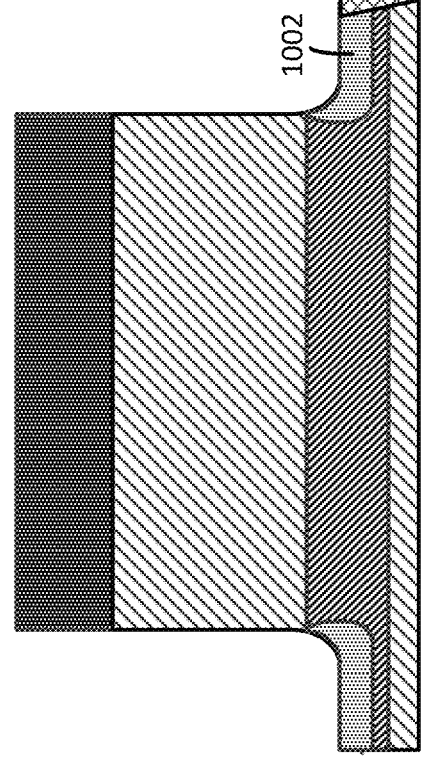

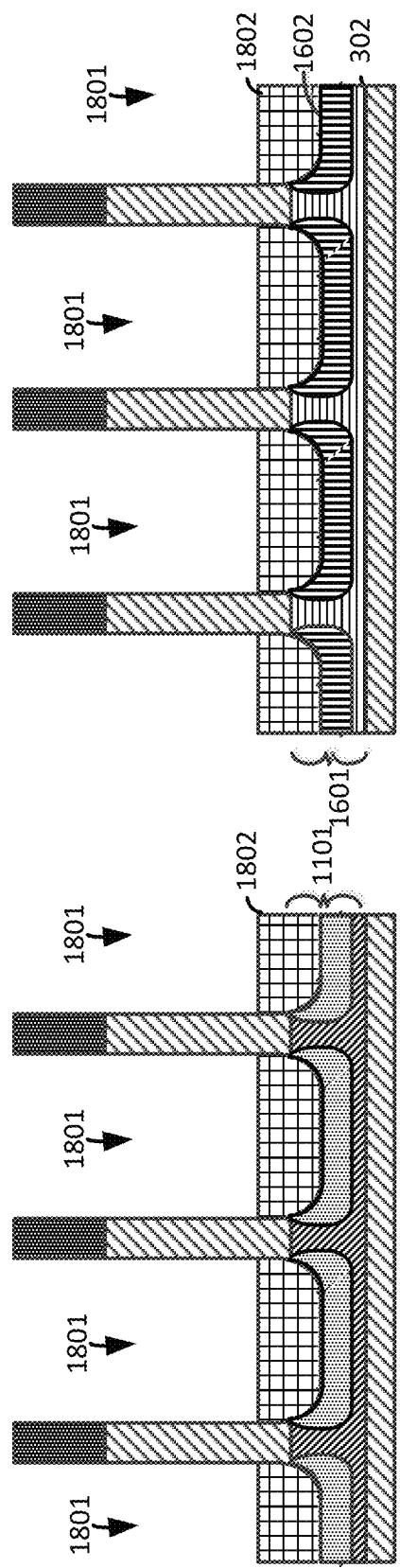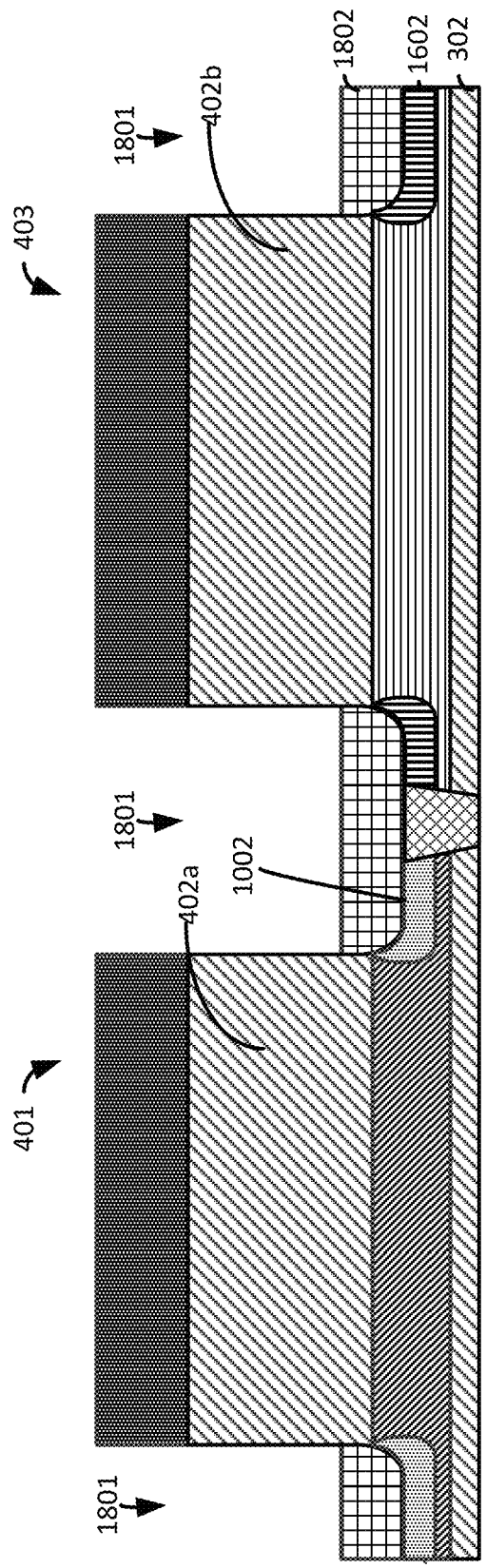
FIG. 18A  FIG. 18B  FIG. 18C

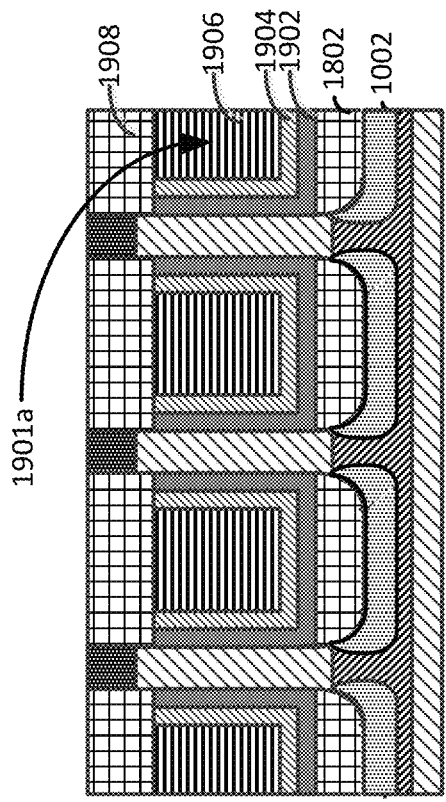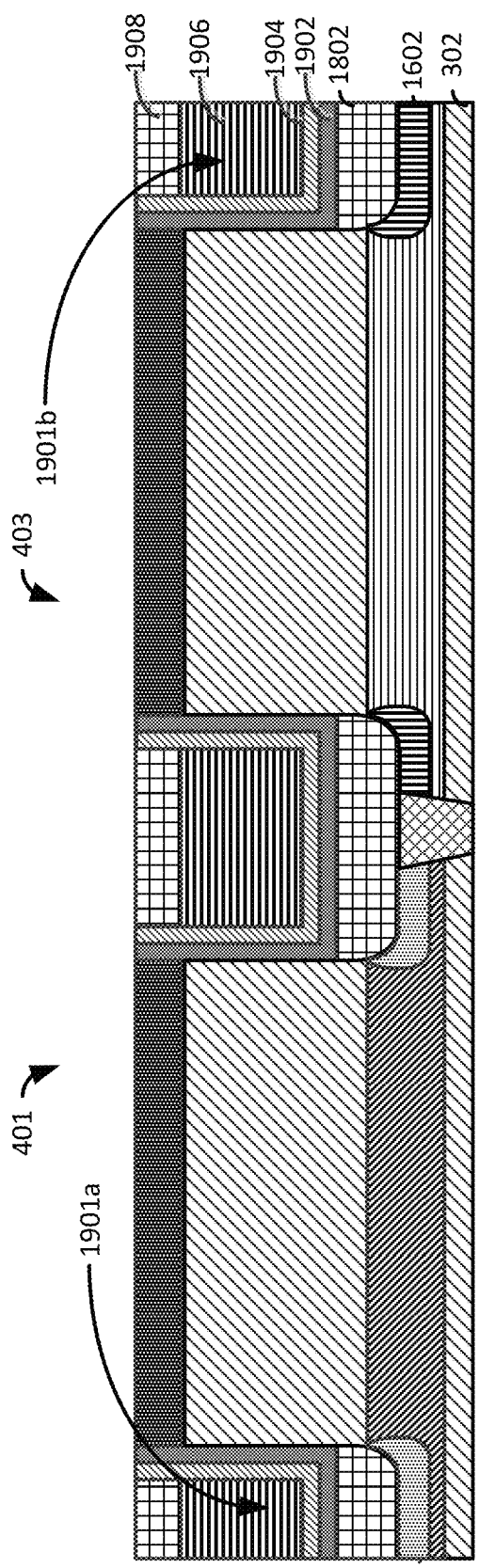
FIG. 19A
FIG. 19B
FIG. 19C

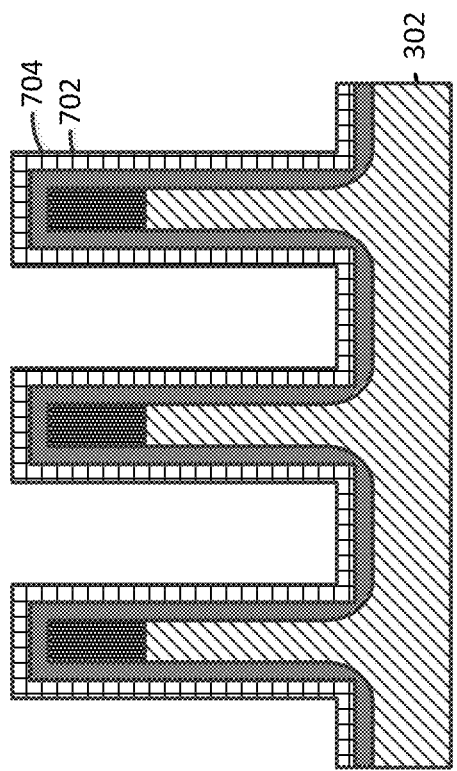
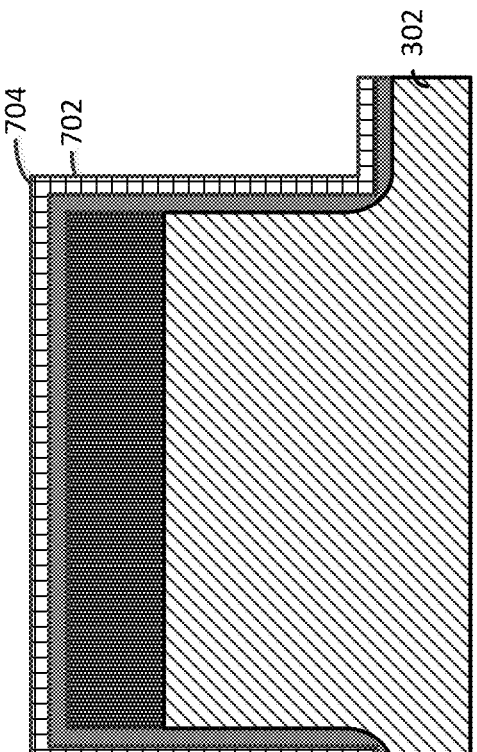
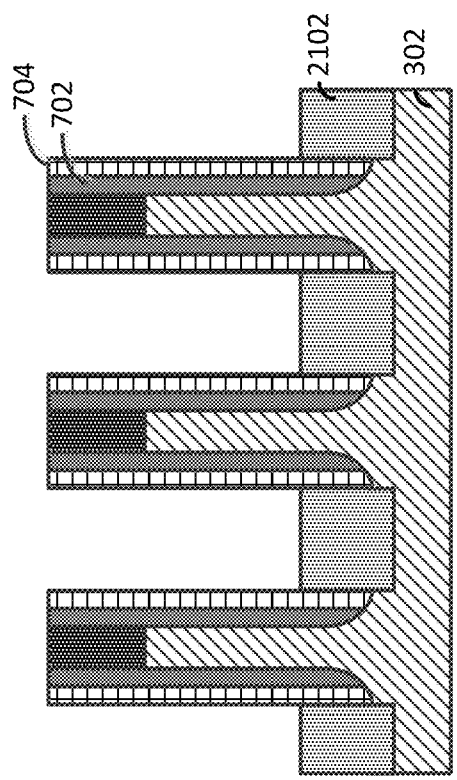
FIG. 21A
FIG. 21B
FIG. 21C

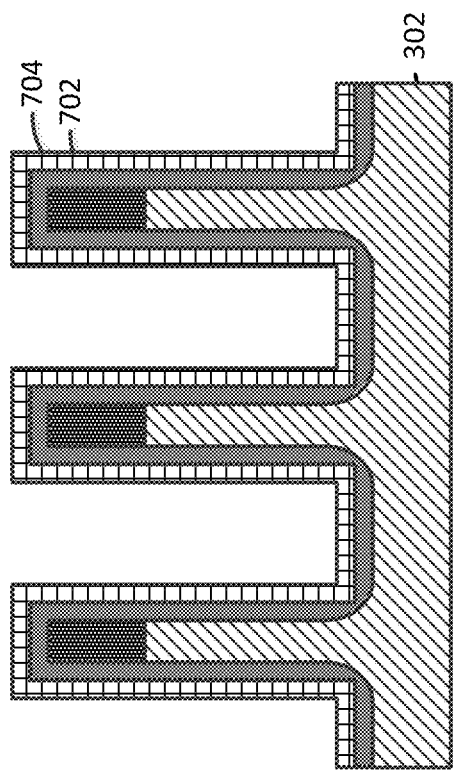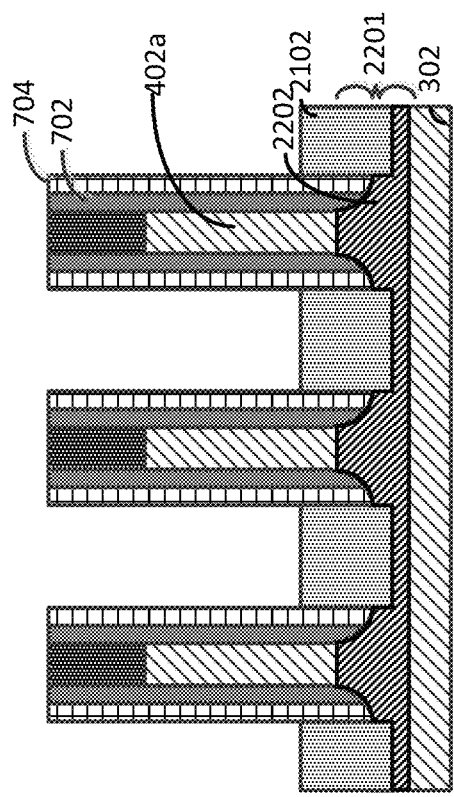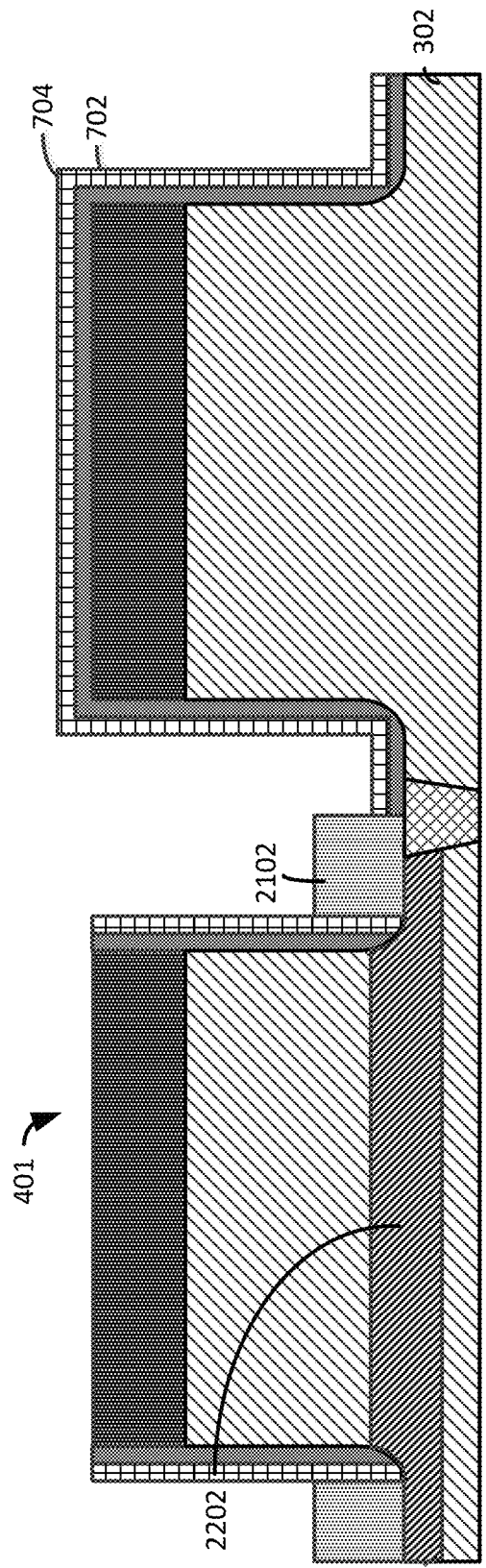

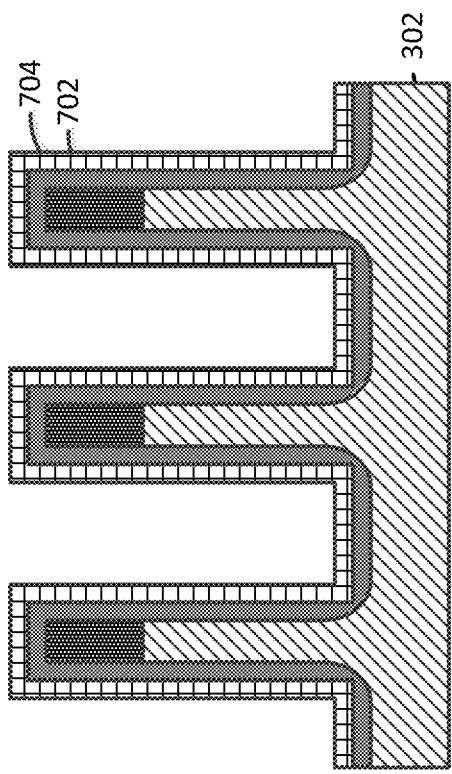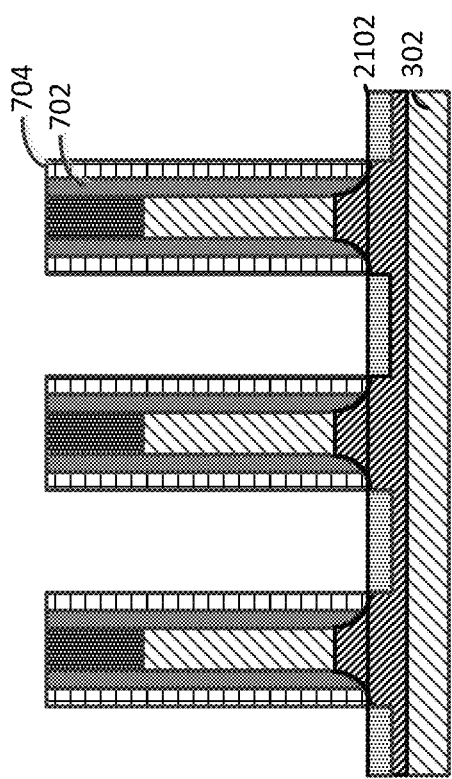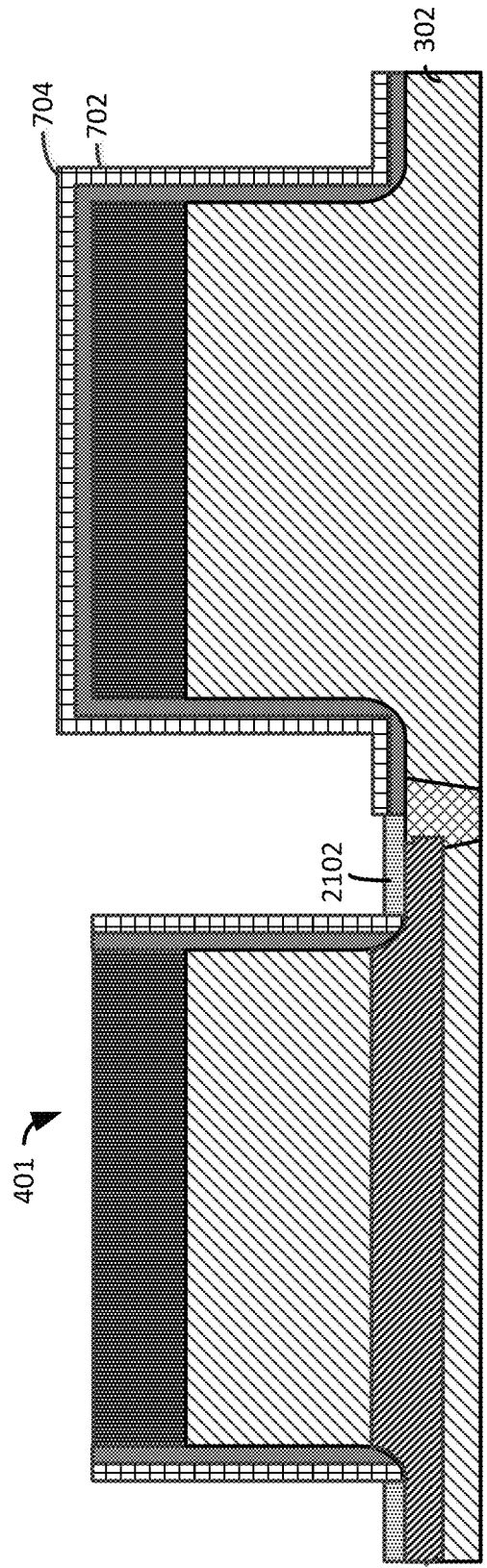

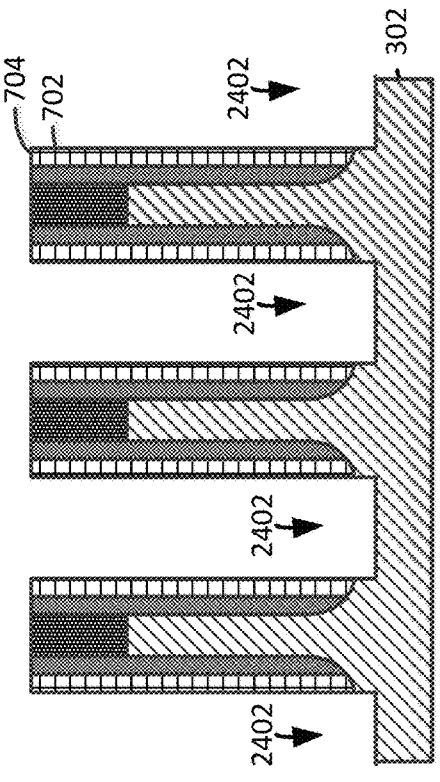
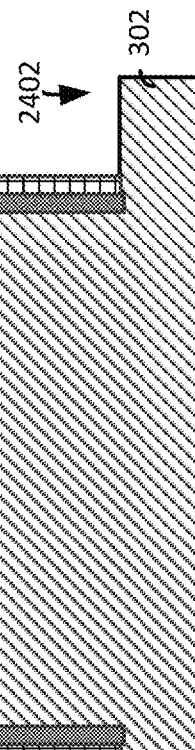
FIG. 24B
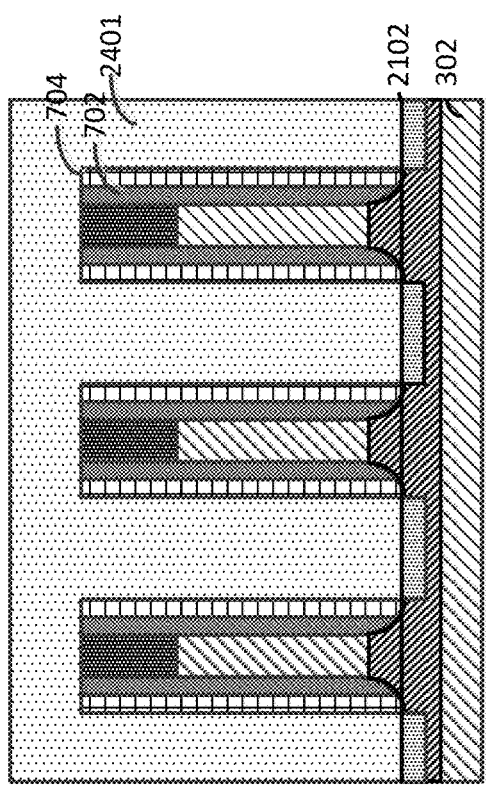
FIG. 24A
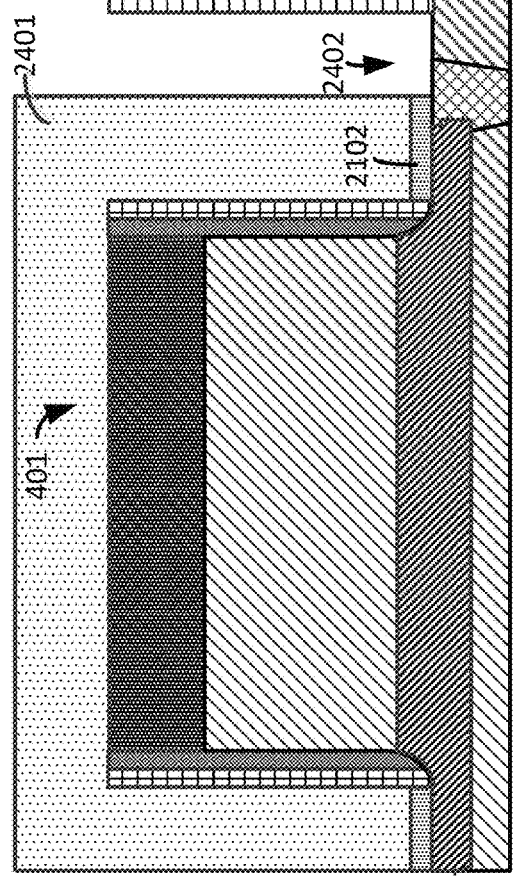
FIG. 24C

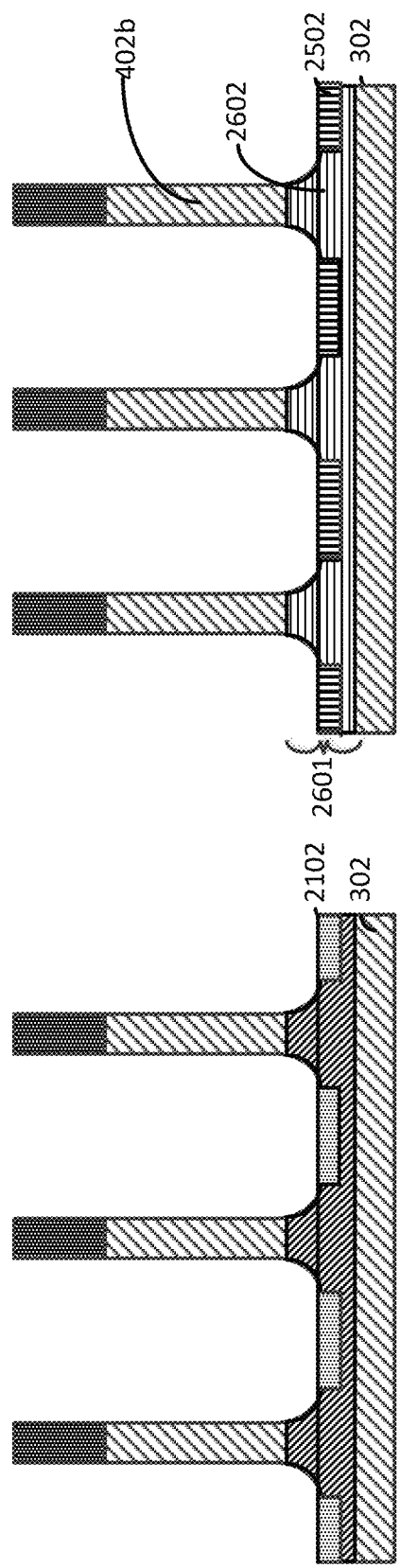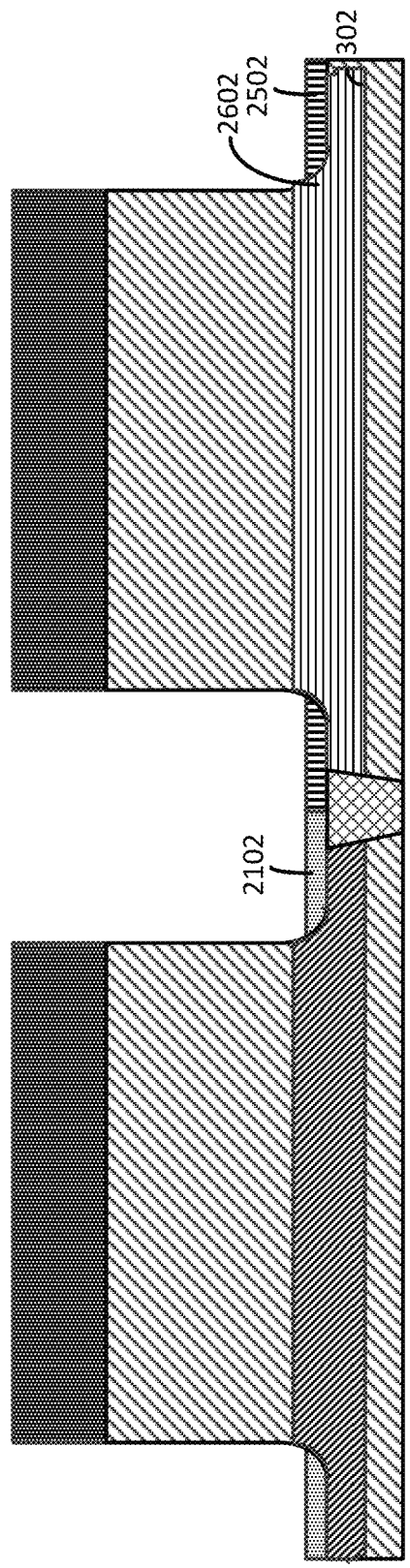

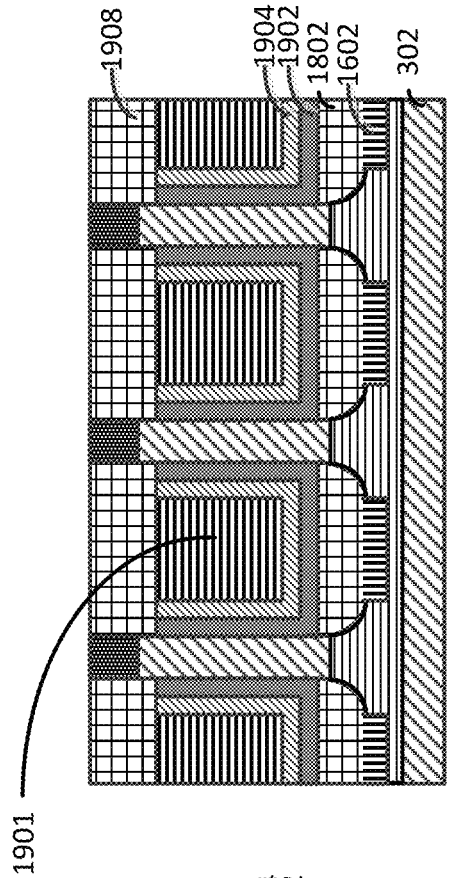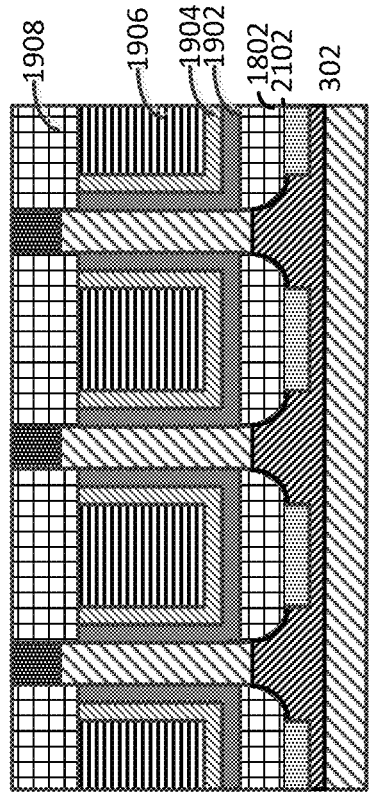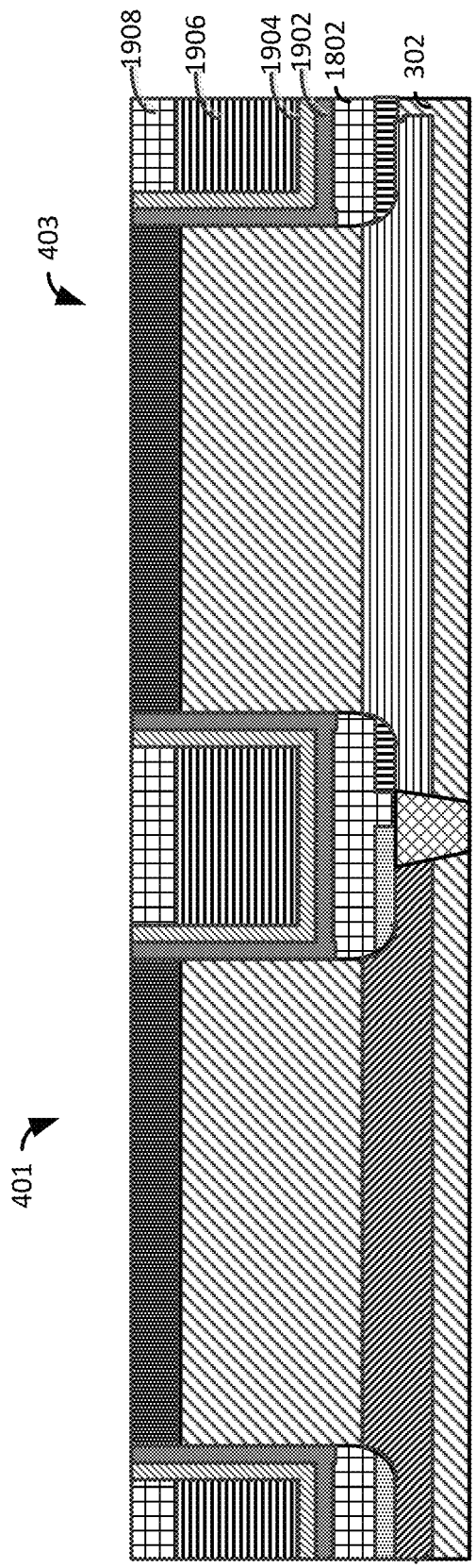

VERTICAL TRANSISTOR DEVICE

DOMESTIC PRIORITY

This application is a divisional of U.S. patent application Ser. No. 15/017,868, filed Feb. 8, 2016, the disclosure of which is incorporated by reference herein in its entirety.

BACKGROUND

The present invention generally relates to complimentary metal-oxide semiconductors (CMOS) and metal-oxide-semiconductor field-effect transistors (MOSFET), and more specifically, to vertical transistor technology.

The MOSFET is a transistor used for switching electronic signals. The MOSFET has a source, a drain, and a metal oxide gate electrode. The metal gate is electrically insulated from the main semiconductor n-channel or p-channel by a thin layer of insulating material, for example, silicon dioxide or high dielectric constant (high-k) dielectrics, which makes the input resistance of the MOSFET relatively high. The gate voltage controls whether the path from drain to source is an open circuit ("off") or a resistive path ("on").

N-type field effect transistors (NFET) and p-type field effect transistors (PFET) are two types of complementary MOSFETs. The NFET uses electrons as the current carriers and with n-doped source and drain junctions. The PFET uses holes as the current carriers and with p-doped source and drain junctions.

The FinFET is a type of MOSFET. The FinFET is a multiple-gate MOSFET device that mitigates the effects of short channels and reduces drain-induced barrier lowering. The "fin" refers to a semiconductor material patterned on a substrate that often has three exposed surfaces that form the narrow channel between source and drain regions. A thin dielectric layer arranged over the fin separates the fin channel from the gate. Since the fin provides a three dimensional surface for the channel region, a larger channel length may be achieved in a given region of the substrate as opposed to a planar FET device.

As CMOS scales to smaller dimensions, vertical FET devices provide advantages. A vertical FET often comprises an active source/drain region layer arranged on a substrate. A bottom spacer layer is arranged on the active source/drain region layer. The channel region of the FET device is arranged on the bottom spacer layer. The channel region may include any number of shapes including a fin shape.

The gate stack is arranged on the bottom spacer layer and around the channel region. A top spacer layer is arranged on the gate stack. The spacers are used to define the channel region in active areas of a semiconductor substrate located adjacent to the gate.

Device scaling drives the semiconductor industry, which reduces costs, decreases power consumption, and provides faster devices with increased functions per unit area. Improvements in optical lithography have played a major role in device scaling. However, optical lithography has limitations for minimum dimensions, which are determined by the wavelength of the irradiation.

SUMMARY

According to an embodiment of the present invention, a method for forming a semiconductor device includes patterning a first fin in a semiconductor substrate, forming a liner layer over the first fin and the semiconductor substrate, removing a first portion of the liner layer to expose a first portion of the semiconductor substrate adjacent to the first fin, removing a portion of the exposed semiconductor substrate to form a first cavity, performing an isotropic etching process to remove portions of the semiconductor substrate in the first cavity and form a first undercut region below the liner layer, growing a first epitaxial semiconductor material in the first undercut region and the first cavity, and performing a first annealing process to drive dopants from the first epitaxial semiconductor material into the first fin to form a first source/drain layer under the first fin and in portions of the semiconductor substrate.

According to another embodiment of the present invention, a method for forming a semiconductor device includes, patterning a first fin in a semiconductor substrate, forming a liner layer over the first fin and the semiconductor substrate, removing a first portion of the liner layer to expose a first portion of the semiconductor substrate adjacent to the first fin, removing a portion of the exposed semiconductor substrate to form a first cavity, growing a first epitaxial semiconductor material in the first cavity, and performing a first annealing process to drive dopants from the first epitaxial semiconductor material into the first fin to form a first source/drain layer under the first fin and in portions of the semiconductor substrate.

According to an embodiment of the present invention, a semiconductor device includes a semiconductor substrate, a first semiconductor fin arranged on the semiconductor substrate, a first source/drain region includes a first portion arranged under the first fin in the semiconductor substrate and a second portion arranged adjacent to the first fin, the second portion includes a first epitaxially grown crystalline semiconductor material, a first spacer layer arranged on the first source/drain region, and a first gate stack arranged on the first spacer layer.

BRIEF DESCRIPTION OF THE DRAWINGS

FIG. 1 illustrates a side view of an example of a semiconductor substrate, a doped semiconductor layer arranged on the semiconductor substrate, and a layer of semiconductor material.

FIG. 2 illustrates a side view following the formation of fins that are used as channel regions for the vertical FET device.

FIGS. 3-19C illustrate an exemplary method for fabricating a vertical FET device.

FIG. 3 illustrates a side view of a bulk semiconductor substrate (substrate) and a hardmask layer arranged on the substrate.

FIG. 4 illustrates the resultant structure following an anisotropic etching process such as, for example, a reactive ion etching process that removes exposed portions of the hardmask layer and the semiconductor substrate to form fins.

FIG. 5 illustrates a top view of the fins and the substrate.

FIGS. 12A-12C illustrate cut-away views following the deposition of a third liner layer over the source/drain region, the epitaxially grown semiconductor material, the fins and portions of the liner layers in the first semiconductor region.

FIGS. 13A-13C illustrate cut-away views of the resultant structure following the patterning of a second resist mask over the first semiconductor region and an anisotropic etch of exposed sacrificial liner layers.

FIGS. 16A-16C illustrate cutaway views following the formation of a source/drain region.

FIGS. 17A-17C illustrate cutaway views following the removal of the remaining portions of the liner layers and the third liner layer (of FIGS. 16A-16C).

FIGS. 18A-18C illustrate cutaway views of the resultant structure following the formation of a spacer (bottom spacer) over exposed portions of the source/drain layers.

FIGS. 19A-19C illustrate cutaway views of the resultant structure following the formation metal gates (gate stacks) and the spacer over the replacement metal gates.

FIGS. 20A-24B illustrate an alternate exemplary method for fabricating another embodiment of a vertical FET device.

FIGS. 20A-20C are similar to FIGS. 8A-8C respectively described above. In FIG. 20A, the cavity has been formed in the substrate using an anisotropic etching process.

FIGS. 21A-21C illustrate cut-away views of the resultant structure following an epitaxial growth process that forms doped epitaxially grown (crystalline) semiconductor material on exposed portions of the substrate and in the cavity (of FIGS. 20A-20C).

FIGS. 22A-22C illustrate cut-away views following the formation of a source/drain region.

FIGS. 23A-23C illustrate cutaway views of the resultant structure following a selective isotropic etching process that removes exposed portions of the epitaxially grown semiconductor material FIGS. 24A-24C illustrate cut-away views of the resultant structure following the patterning of a second resist mask over the first semiconductor region, an anisotropic etch of exposed sacrificial liner layers, and an anisotropic etching process that removes exposed portions of the substrate and forms the cavities.

FIGS. 27A-27C illustrate cutaway views following the removal of the remaining portions of the liner layers (of FIGS. 26A-26C).

FIGS. 28A-28C illustrate cutaway views of the resultant structure following the formation of metal gates (gate stacks) and the spacer over the metal gates.

DETAILED DESCRIPTION

Vertical field effect transistor (FET) devices provide opportunities to increase device density on a wafer. Vertical FET devices have a source/drain region arranged on a substrate. The channel region is arranged vertically above the substrate such that the gate stack may wrap around the channel region.

Figure 1:
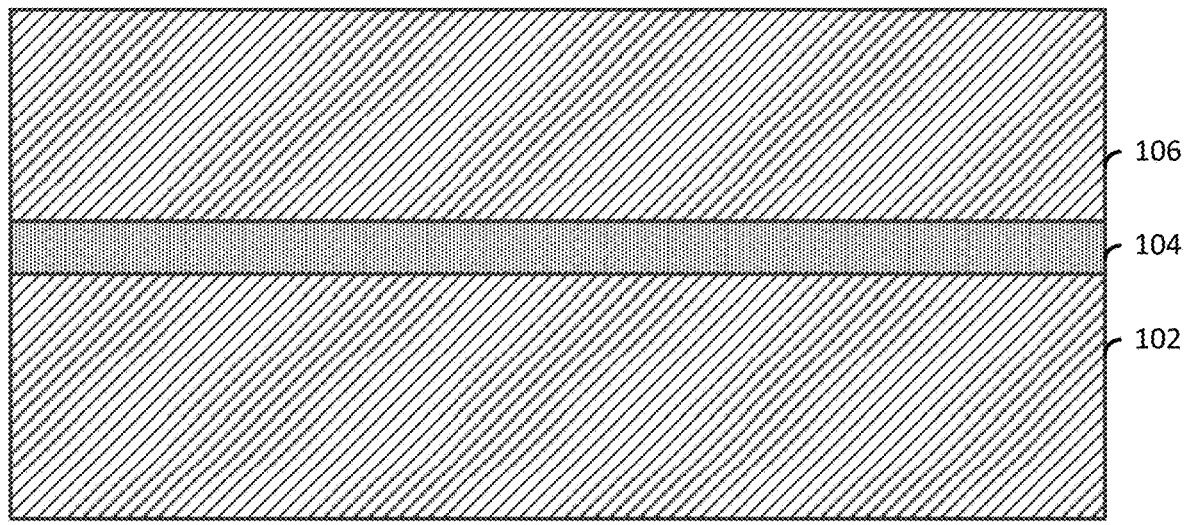
FIGS. 1-2 illustrate an example of forming channel regions for a vertical FET device.
Figure 2:
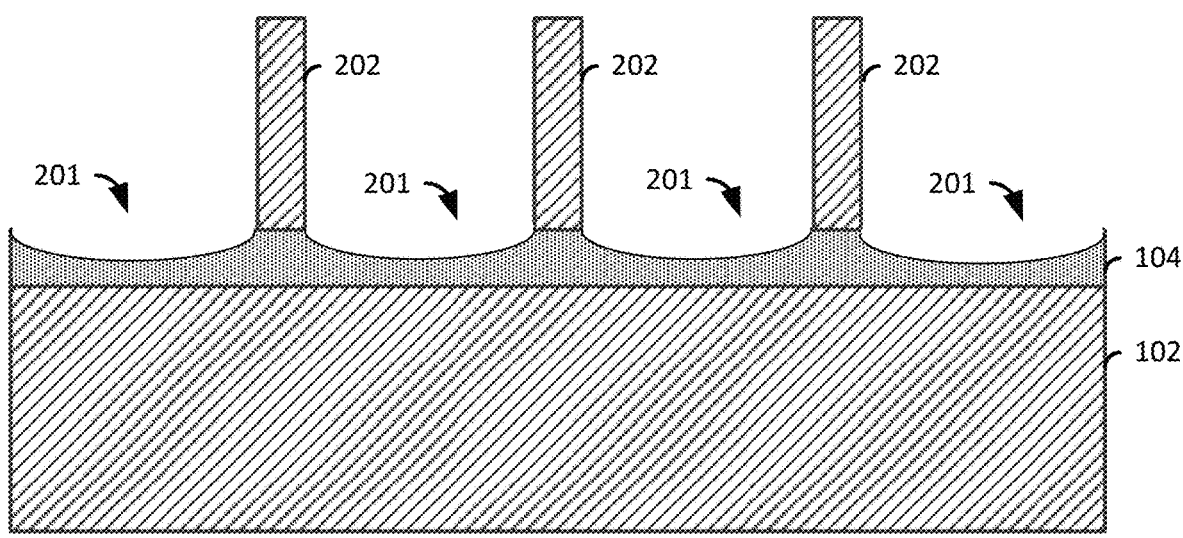

FIGS. 1-2 illustrate an example of forming channel regions for a vertical FET device.

FIG. 1 illustrates a side view of an example of a semiconductor substrate 102, a doped semiconductor layer 104 arranged on the semiconductor substrate 102, and a layer of semiconductor material 106 arranged on the doped semiconductor layer 104. The doped semiconductor layer 104 would be used as a bottom source/drain region in a vertical FET device. A patterning process is used to form the channel regions of the device by removing portions of the layer of semiconductor material 106.

FIG. 2 illustrates a side view following the formation of fins that are used as channel regions 202 for the vertical FET device. The channel regions 202 have been formed by an anisotropic etching process. Though anisotropic etching processes may be selective to particular materials, since the layer of semiconductor material 106, and the doped semiconductor layer 104 are similar materials, the selectivity of the etching process is not high enough to discriminate between the materials in the layer of semiconductor material 106 and the doped semiconductor layer 104. This results in an undesirable cavity 201 that is formed by the removal of portions of the doped semiconductor layer 104. The cavity 201 undesirably reduces the thickness of the doped semiconductor layer 104 and may cause an undesirable variability in alignment between the spacer and gate stack relative to the channel in subsequent fabrication processes.

FIGS. 3-19C illustrate an exemplary method for fabricating a vertical FET device.

Figure 3:
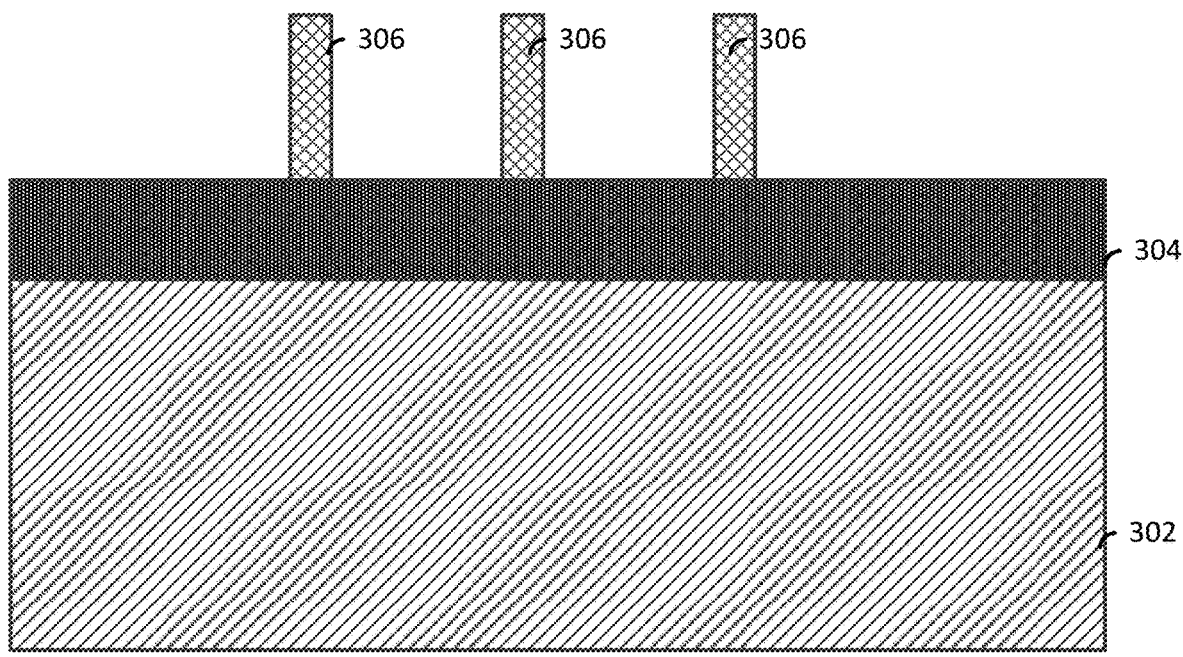

FIG. 3 illustrates a side view of a bulk semiconductor substrate (substrate) 302 and a hardmask layer 304 arranged on the substrate 302. The substrate 302 may include, for example, silicon, germanium, silicon germanium, silicon carbide, and those consisting essentially of III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). The semiconductor substrate 302 may also comprise an organic semiconductor or a layered semiconductor such as, for example, Si/SiGe, a silicon-on-insulator or a SiGe-on-insulator. A portion or entire semiconductor substrate 302 may be amorphous, polycrystalline, or monocrystalline. In addition to the aforementioned types of semiconductor substrates, the semiconductor substrate employed in the present invention may also comprise a hybrid oriented (HOT) semiconductor substrate in which the HOT substrate has surface regions of different crystallographic orientation. The semiconductor substrate 302 may be doped, undoped or contain doped regions and undoped regions therein. The semiconductor substrate may contain regions with strain and regions without strain therein, or contain regions of tensile strain and compressive strain.

A hardmask layer 304 is arranged on the substrate 302. The hardmask layer 304 may include, for example, silicon oxide, silicon nitride (SiN), SiOCN, SiBCN or any suitable combination of those. Hardmask layer 304 may be deposited using a deposition process, including, but not limited to, PVD, CVD, PECVD, ALD or any combination thereof.

In the illustrated embodiment, an oxide mask 306 is patterned on the hardmask layer 304 using a sidewall image transfer process. Other exemplary embodiments may use any suitable type process to pattern the fins described below.

Figure 4:
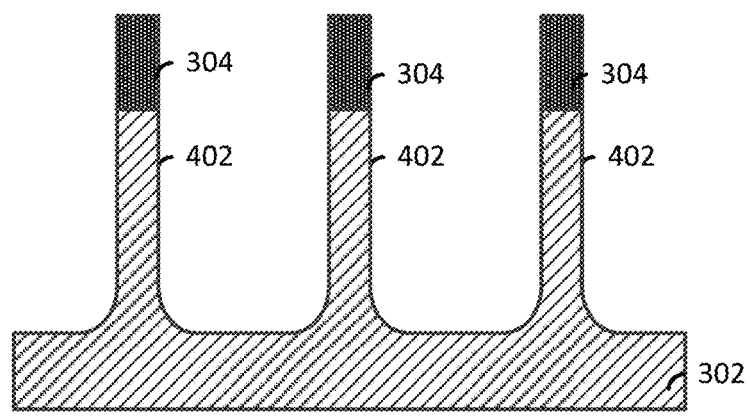

FIG. 4 illustrates the resultant structure following an anisotropic etching process such as, for example, a reactive ion etching (ME) process that removes exposed portions of the hardmask layer 304 and the semiconductor substrate 302 to form fins 402.

Figure 5:
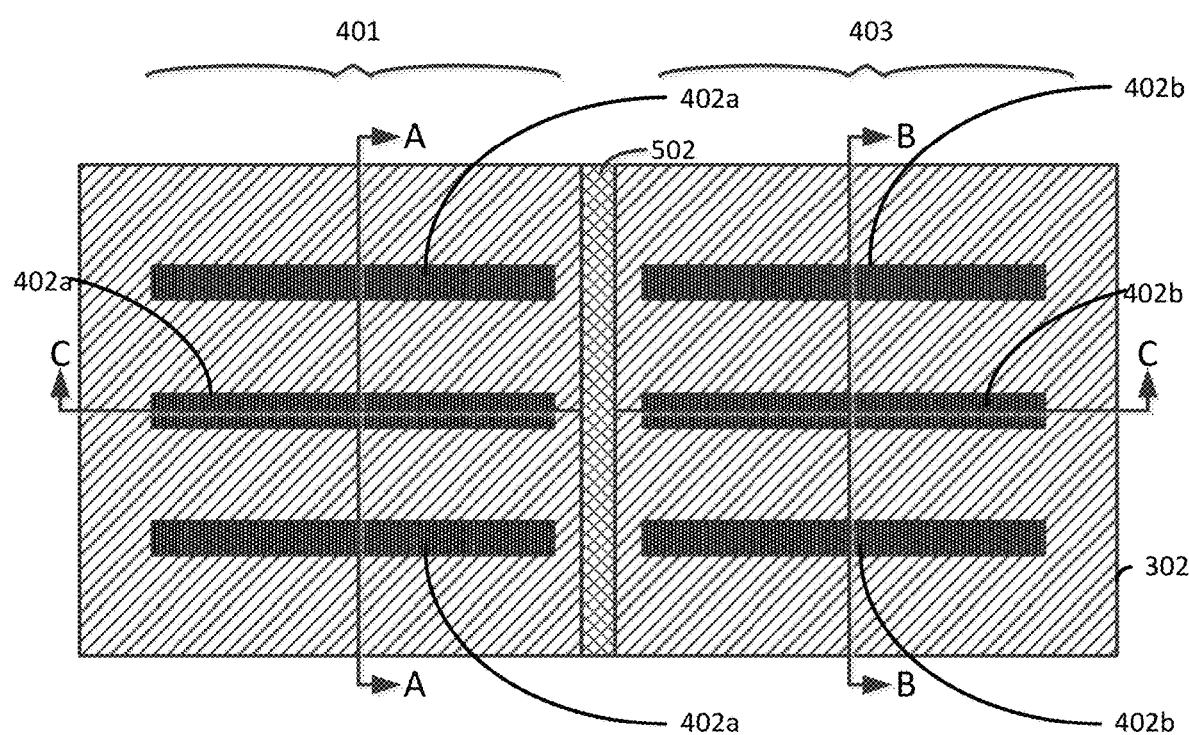

FIG. 5 illustrates a top view of the fins 402 and the substrate 302. In the illustrated embodiment, a shallow trench isolation (STI) (isolation) region 502 is formed in the substrate 302. The STI region 502 may be formed by, any suitable process including, for example, lithography or etching to form trenches, and then filling the trenches with an insulating material, such as silicon dioxide. In the illustrated embodiment, at least one isolation region is a shallow trench isolation region ("STI"). However, the isolation region 502 may be a trench isolation region, a field oxide isolation region (not shown), or any other type of isolation region. The isolation region 502 provides isolation between neighboring fin and gate structure regions, and may be used when the neighboring fins and gates have opposite conductivities, e.g., nFETs and pFETs. As such, the isolation region 502 in the illustrated embodiment separates an nFET device region (or first semiconductor device region) 401 from a pFET device region (or second semiconductor device region) 403. In this regard, the fins 402a are arranged in the first semiconductor device region 401 and the fins 402b are arranged in the second semiconductor device region 402.

Figure 6A:
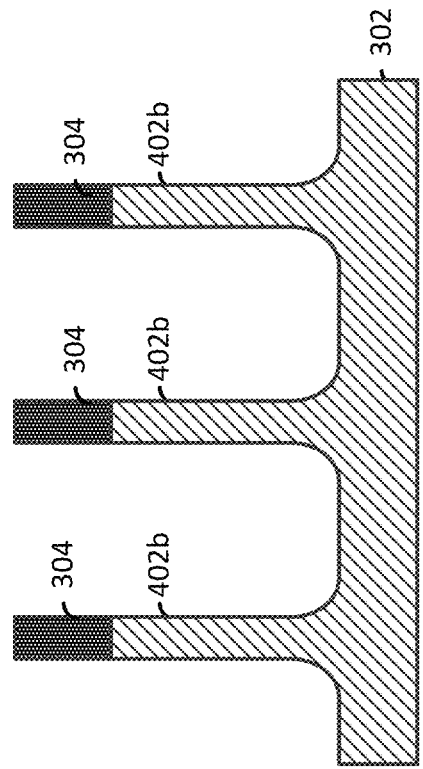
FIG. 6A illustrates a cut-away view along the line A-A (of FIG. 5) of the fins.
Figure 6B:
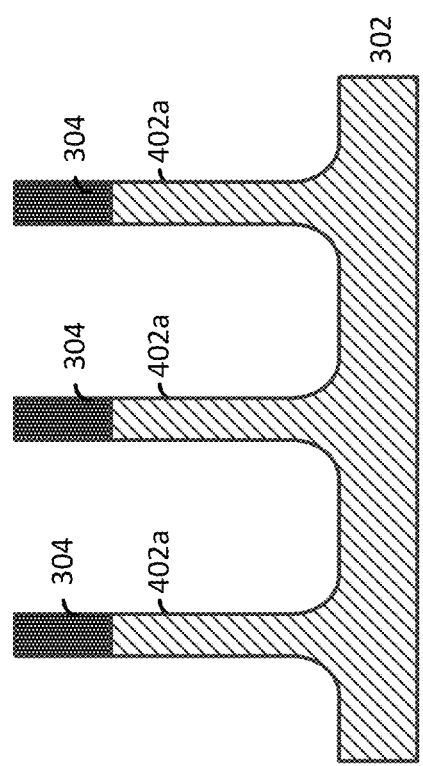
FIG. 6B illustrates a cut-away view along the line B-B (of FIG. 5) of the fins.
Figure 6C:
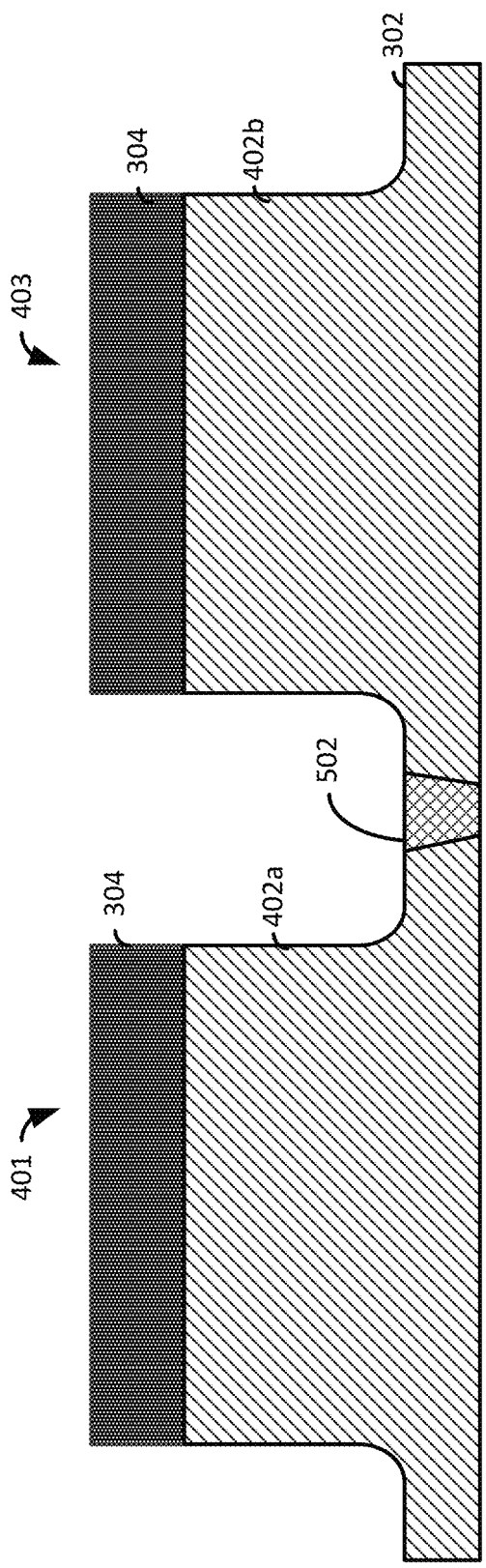
FIG. 6C illustrates a cut-away view along the line C-C (of FIG. 5) of the fins and the STI region.

FIG. 6A illustrates a cut-away view along the line A-A (of FIG. 5) of the fins 402a. FIG. 6B illustrates a cut-away view along the line B-B (of FIG. 5) of the fins 402b. FIG. 6C illustrates a cut-away view along the line C-C (of FIG. 5) of the fins 402a and 402b and the STI region 502. The figures following below will show similar cut away views along the lines A-A, B-B, and C-C of FIG. 5 corresponding to the alphanumeric designations of the figures respectively in the fabrication method.

Figure 7A:
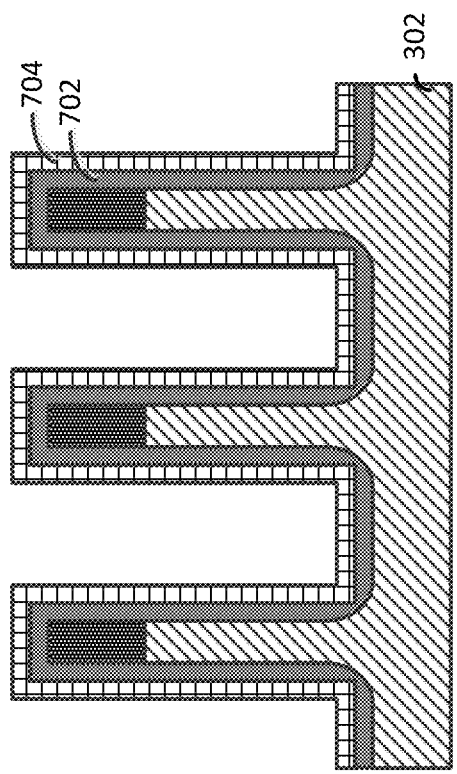
FIGS. 7A-7C illustrate cut away views following the formation of sacrificial liner layers.
Figure 7B:
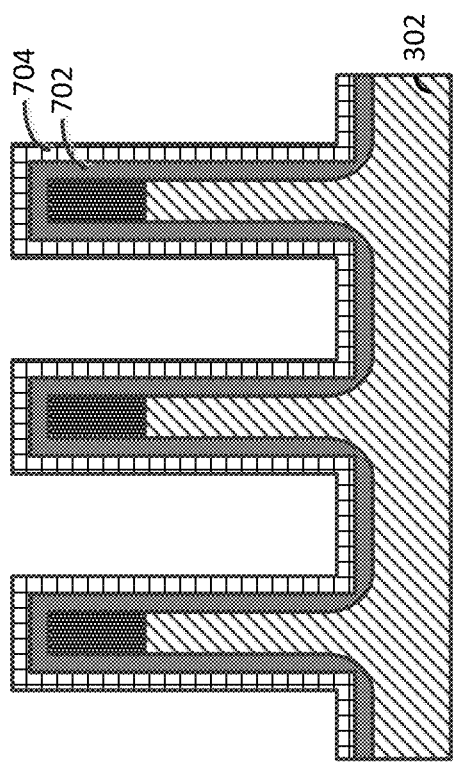
Figure 7C:
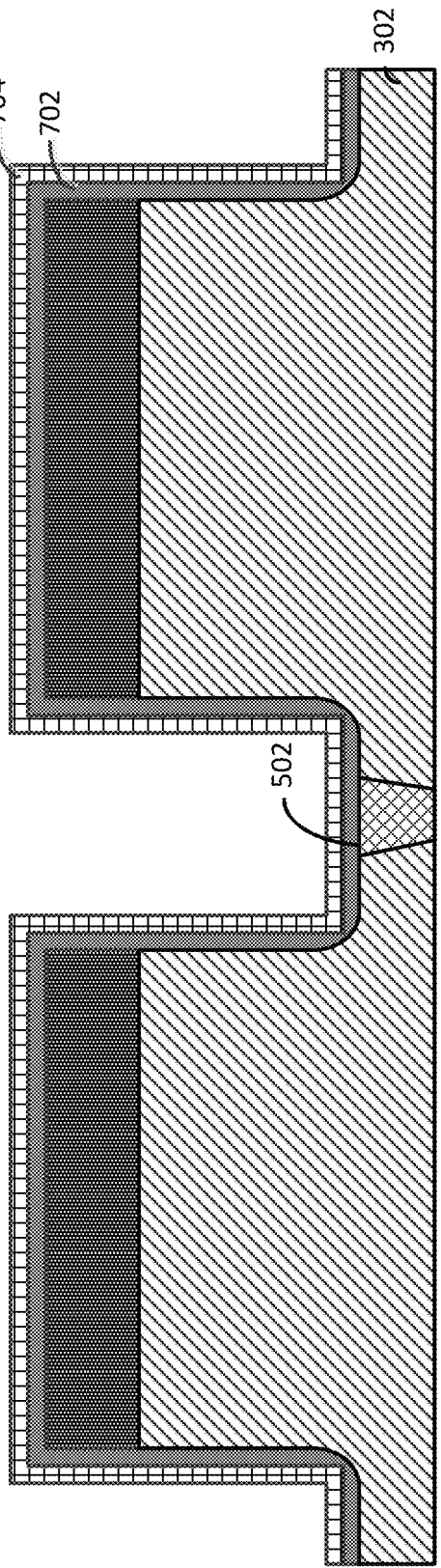

FIGS. 7A-7C illustrate cut away views following the formation of sacrificial liner layers 702 and 704. In the illustrated embodiment, the liner layer 702 is an oxide material and the liner layer 704 includes a nitride material. The liner layer 702 is optional. The liner layers 702 and 704 are formed over the fins 402a and 402b and the substrate 302. Non-limiting examples of suitable materials for the liner layers 702 and 704 include dielectric oxides (e.g., silicon oxide), dielectric nitrides (e.g., silicon nitride), dielectric oxynitrides, or any combination thereof. The liner layers 702 and 704 are deposited by a suitable deposition process, for example, chemical vapor deposition (CVD), atomic layer deposition (ALD), or physical vapor deposition (PVD).

Figure 8A:
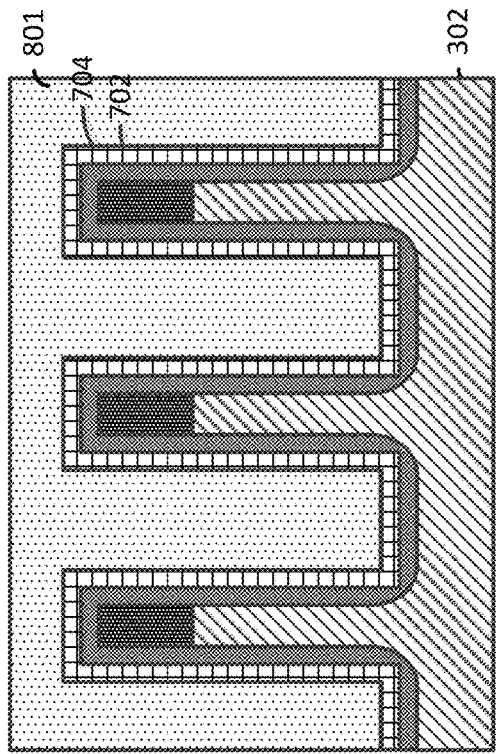
FIGS. 8A-8C illustrate cut away views following the patterning of a resist mask over the second semiconductor device region and anisotropic etching of exposed sacrificial liner layers.
Figure 8B:
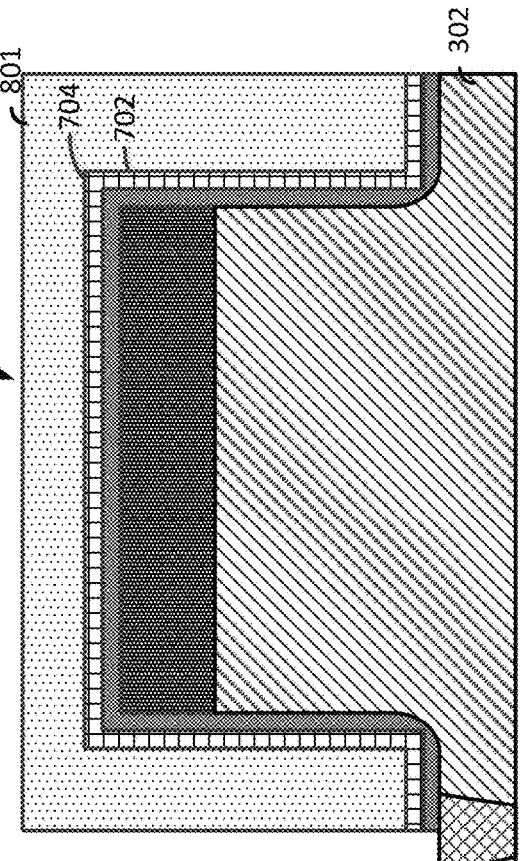
Figure 8C:
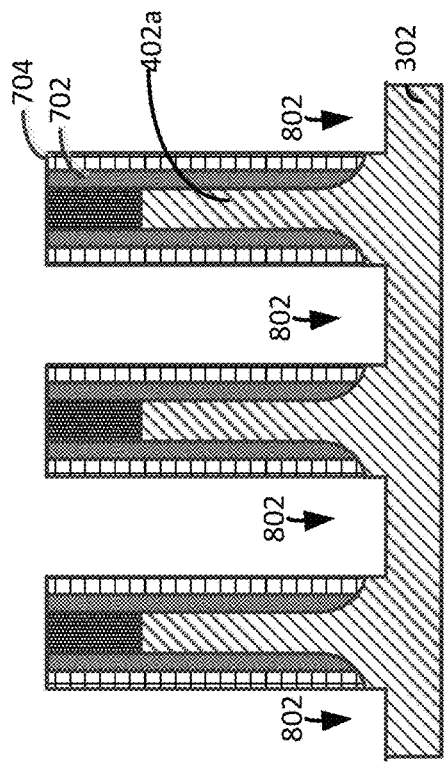

FIGS. 8A-8C illustrate cut away views following the patterning of a resist mask 801 over the second semiconductor device region 403. Suitable resist masks include photoresists, electron-beam resists, ion-beam resists, X-ray resists, and etch resists. The resist may a polymeric spin on material or a polymeric material.

Following the deposition of the resist mask 801, a suitable anisotropic etching process such as, for example, a reactive ion etching process is performed to remove portions of the liner layers 702 and 704 such that portions of the liner layers 702 and 704 remain along the substantially vertical sidewalls of the fins 402a and portions of the substrate 302 are exposed.

After the portions of the liner layers 702 and 704 are removed, a selective anisotropic etching process, such as, for example, RIE is performed to remove exposed portions of the substrate 302. The etching process forms cavities 802 in the substrate 302 adjacent to the liner layer 702 and 704.

Figure 9A:
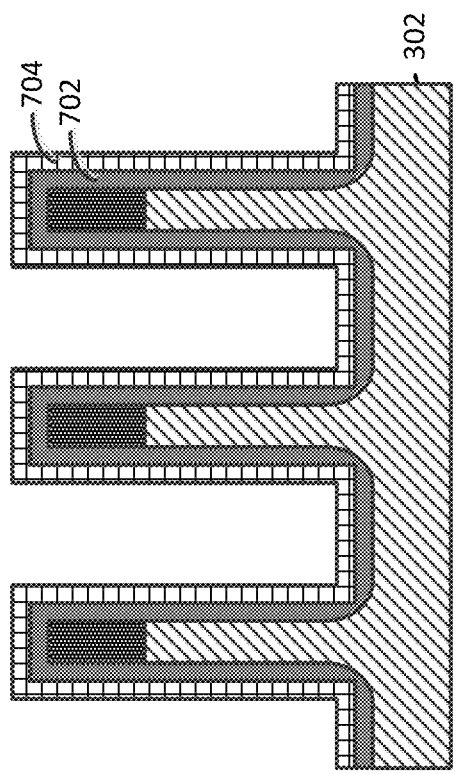
FIGS. 9A-9C illustrate cutaway views of the resultant structure following resist mask removal and a selective isotropic etching process that removes exposed portions of the substrate and the fins and forms an undercut region under the liner layers.
Figure 9B:
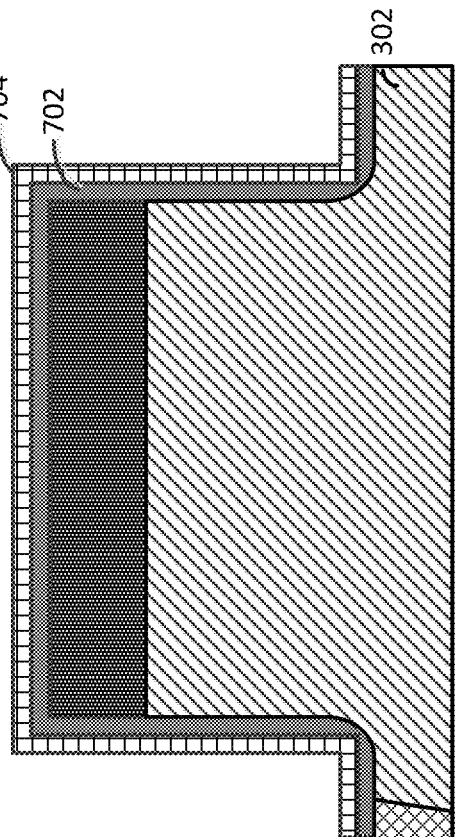
Figure 9C:
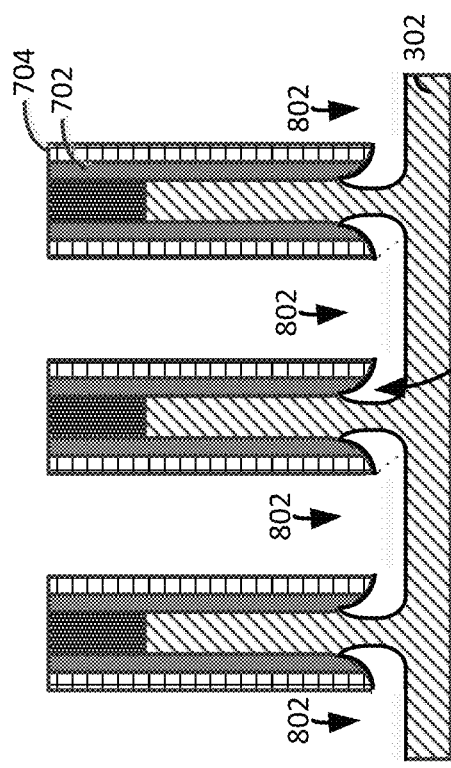

FIGS. 9A-9C illustrate cutaway views of the resultant structure following a selective isotropic etching process such as, a chemical wet or dry etching process that removes exposed portions of the substrate 302 and the fins 402a and forms an undercut region 901 under the liner layers 702 and 704. The resist mask 801 (of FIG. 8C) has been removed using a suitable process such as, for example, an ashing process. The ashing process may be used to remove a photoresist material, amorphous carbon, or organic planarization (OPL) layer. Ashing is performed using a suitable reaction gas, for example, $O_2$, $N_2$, H2/N2, $O_3$, $CF_4$, or any combination thereof.

Figure 10A:
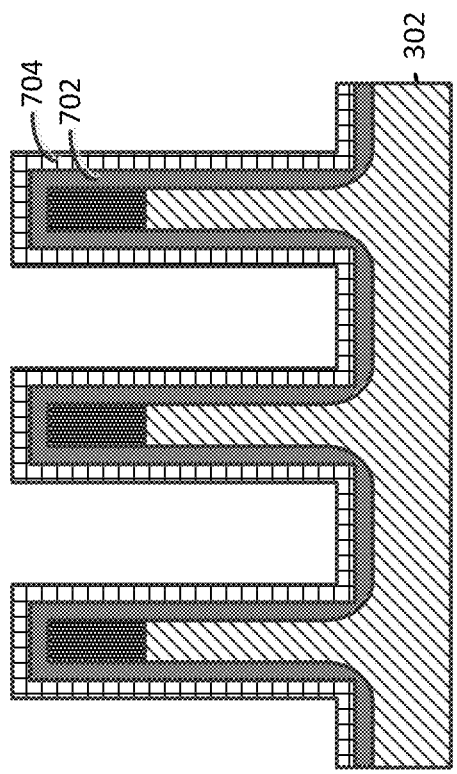
FIGS. 10A-10C illustrate cutaway views of the resultant structure following an epitaxial growth process that forms doped epitaxially grown (crystalline) semiconductor material on exposed portions of the substrate and in the cavity and the undercut region (of FIGS. 9A-9C).
Figure 10B:
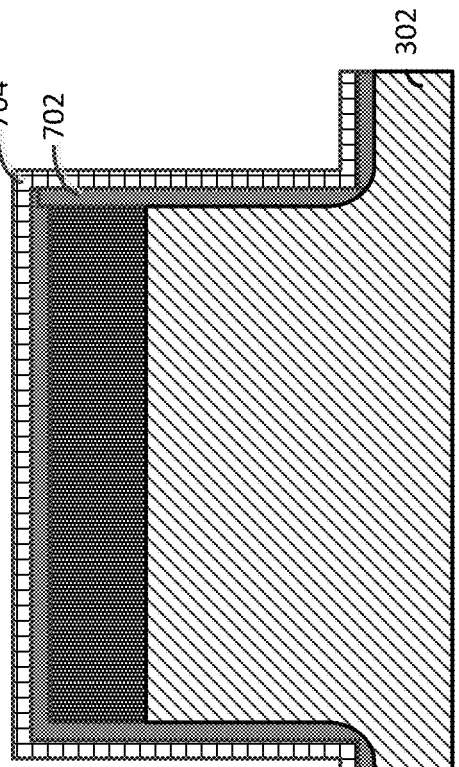
Figure 10C:
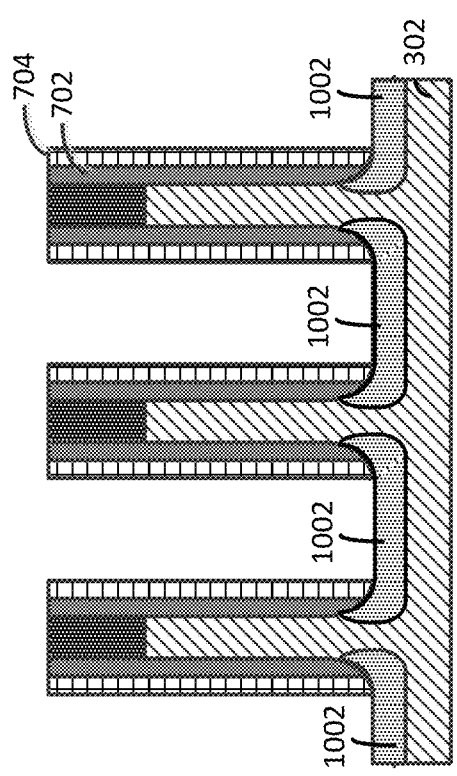

FIGS. 10A-10C illustrate cutaway views of the resultant structure following an epitaxial growth process that forms epitaxially grown (crystalline) semiconductor material 1002 on exposed portions of the substrate 302 and in the cavity 802 and the undercut region 901 (of FIG. 9C).

Epitaxial materials may be grown from gaseous or liquid precursors. Epitaxial materials may be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor. The dopant concentration in the source/drain can range from $1 \times 10^{19}$ cm$^{-3}$ to $2 \times 10^{21}$ cm$^{-1}$, or preferably between $2 \times 10^{20}$ cm$^{-3}$ to $1 \times 10^{21}$ cm$^{-3}$.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

In some embodiments, the gas source for the deposition of epitaxial semiconductor material include a silicon containing gas source, a germanium containing gas source, or a combination thereof. For example, an epitaxial Si layer may be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon may be used.

Figure 11A:
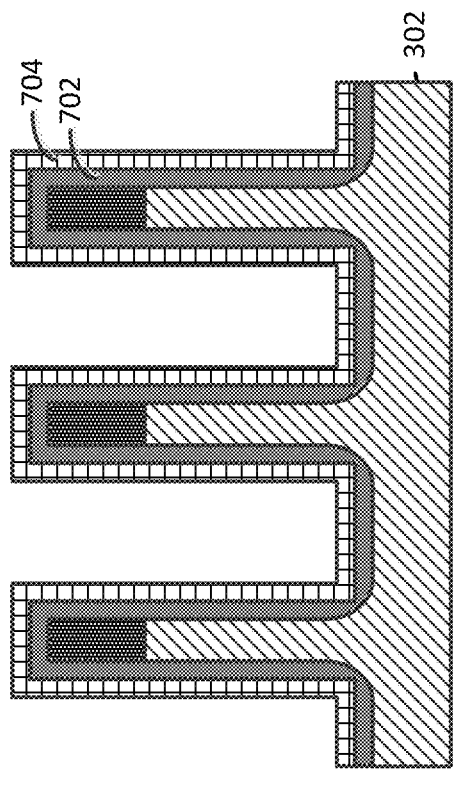
FIGS. 11A-11C illustrate cutaway views following the formation of a source/drain region.
Figure 11C:
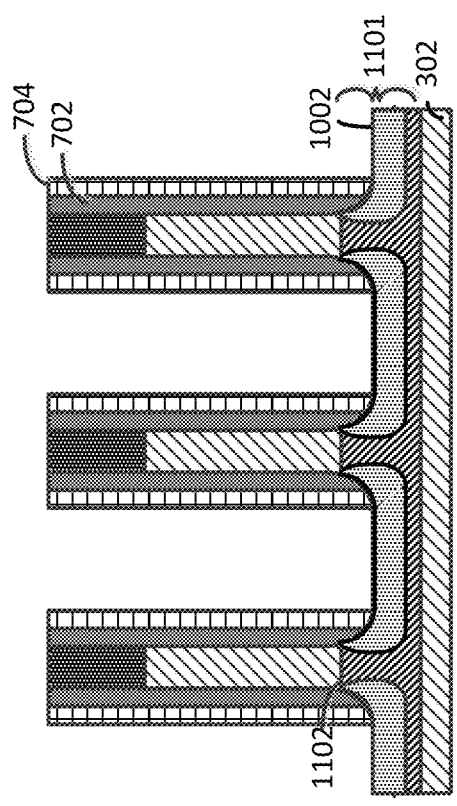
Figure 11B:
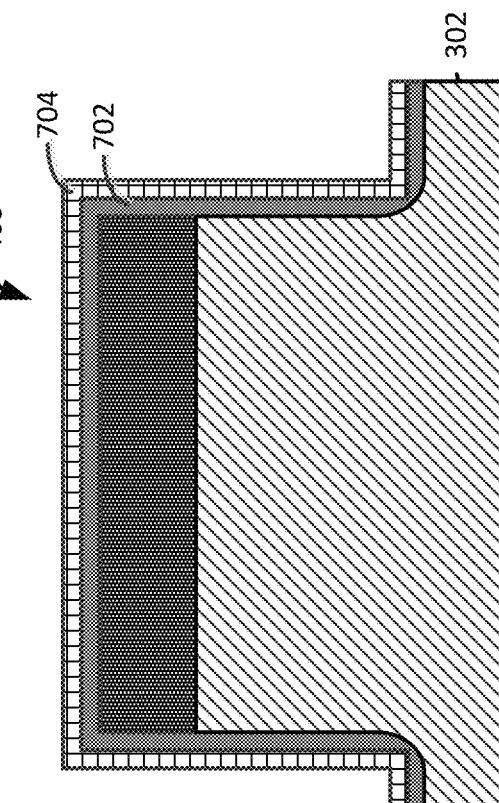

FIGS. 11A-11C illustrate cutaway views following the formation of a source/drain region 1102. The source/drain region 1102 is formed by, for example, an annealing process that drives dopants from the epitaxially grown semiconductor material 1002 into the underlying materials (i.e., portions of the fins 402a and the substrate 302). Since the dopants are driven from the epitaxially grown semiconductor material 1002, the source/drain region 1102 has a graduated doping concentration profile. Collectively, the epitaxially grown semiconductor material 1002 and the source/drain region 1102 define an active source/drain region or layer 1101 of the device.

The annealing process can be performed in an inert environment such as, for example, in a nitrogen or argon environment. The annealing condition is set so as to be sufficient for the dopant diffusion into the underlying materials at a temperature in a range of about 800° C. to about 1200° C. (depending on the source/drain material and dopant concentration for) for a time period of about 3 seconds to about 5 minutes.

FIGS. 12A-12C illustrate cut-away views following the deposition of a third liner layer 1202 over the source/drain region 1102, the epitaxially grown semiconductor material 1002, the fins 402a and portions of the liner layers 702 and 704 in the first semiconductor region 401. The third liner layer 1202 is also disposed over the second semiconductor region 403.

FIGS. 13A-13C illustrate cut-away views of the resultant structure following the patterning of a second resist mask 1301 over the first semiconductor region 401. Following the patterning of the second resist mask 1301, an anisotropic etching process is performed to remove exposed portions of the third liner layer 1202, and the liner layers 702 and 704 to expose portions of the substrate 302 in the second semiconductor region 403. In the resultant structure, portions of the third liner layer 1202 and the liner layers 702 and 704 remain along the sidewalls of the fins 402b. After portions of the third liner layer 1202 and the liner layers 702 and 704 are removed and portions of the substrate 302 are exposed, a suitable anisotropic etching process such as, for example, RIE is performed to remove exposed portions of the substrate 302 and form cavities 1302.

Figure 14A:
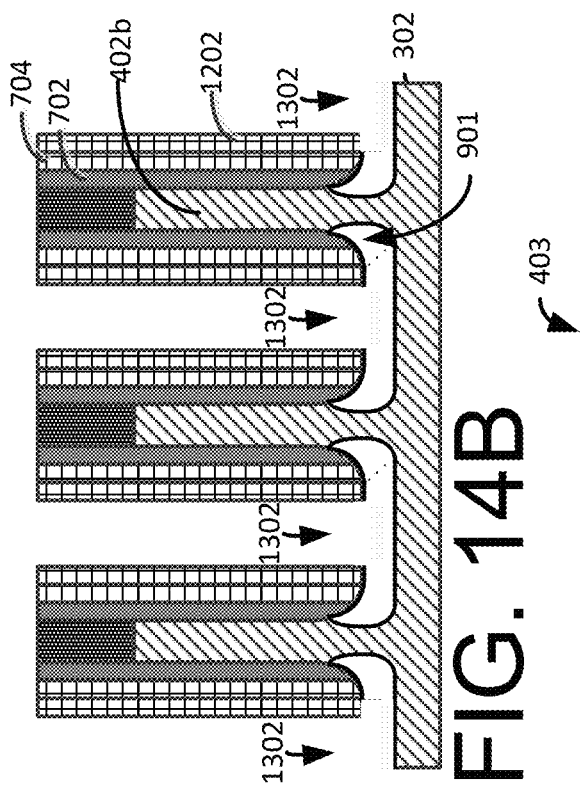
FIGS. 14A-14C illustrate cutaway views of the resultant structure following a selective isotropic etching process that removes exposed portions of the substrate and the fins and forms an undercut region.
Figure 14B:
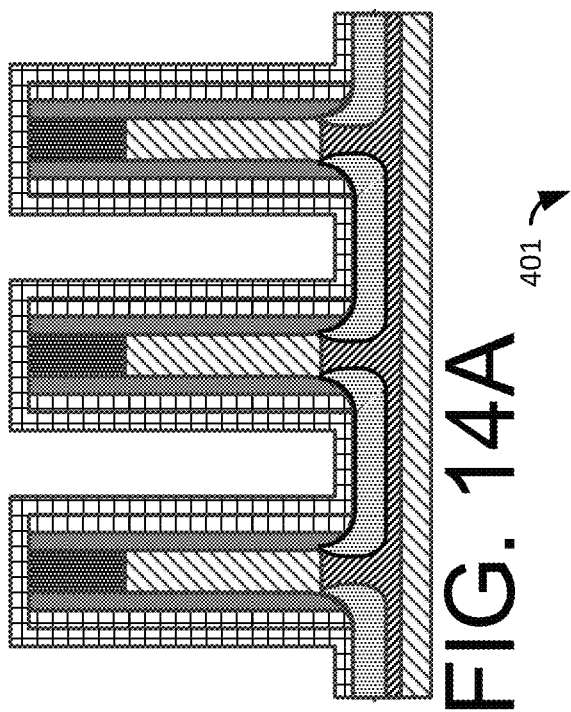
Figure 14C:
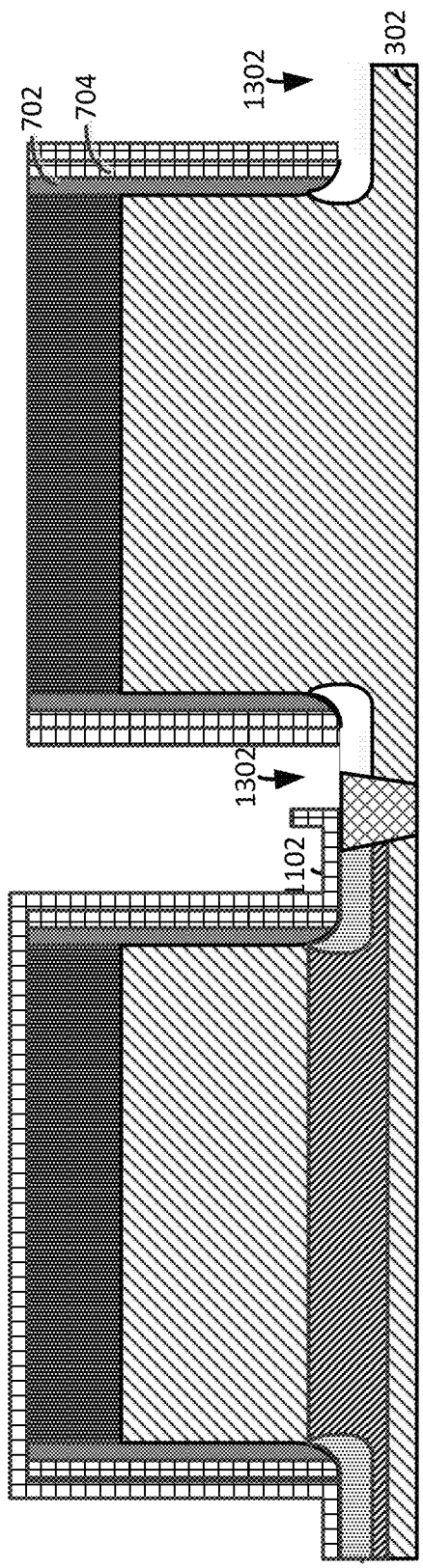

FIGS. 14A-14C illustrate cutaway views of the resultant structure following a selective isotropic etching process such as, a chemical or dry wet etching process that removes exposed portions of the substrate 302 and the fins 402b and forms an undercut region 1401 by extending the cavity 1302 under the liner layers 702 and 704 and the third liner layer 1202. The resist mask 1301 (of FIG. 13C) has been removed using a suitable process such as, for example, an ashing process.

Figure 15A:
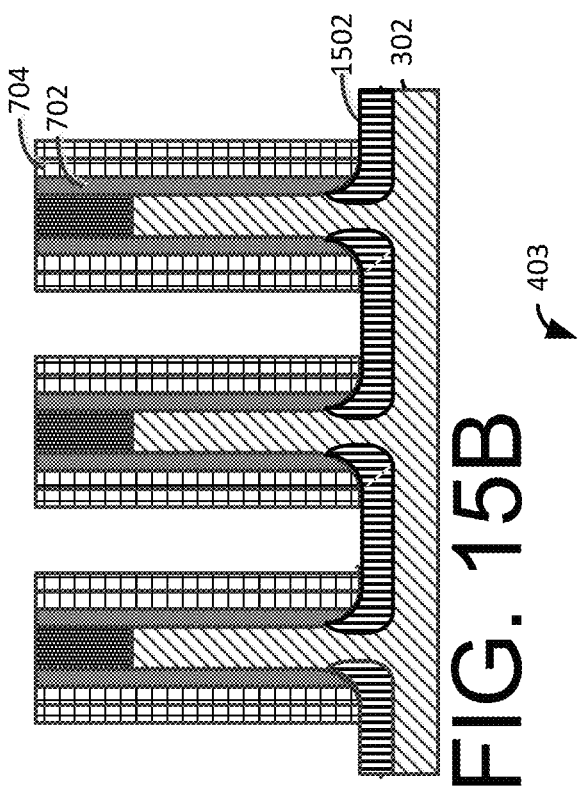
FIGS. 15A-15C illustrate cutaway views of the resultant structure following an epitaxial growth process that forms epitaxially grown (crystalline) semiconductor material on exposed portions of the substrate and in the cavity (of FIGS. 14A-14C).
Figure 15B:
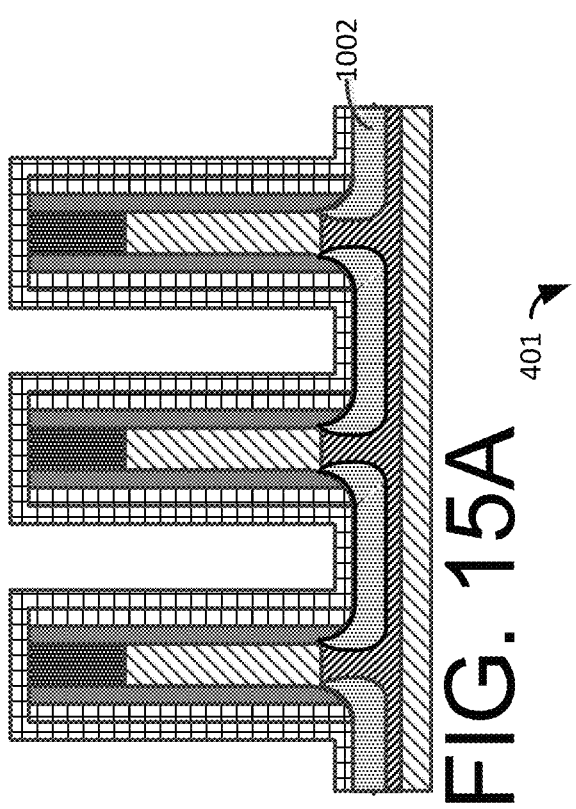
Figure 15C:
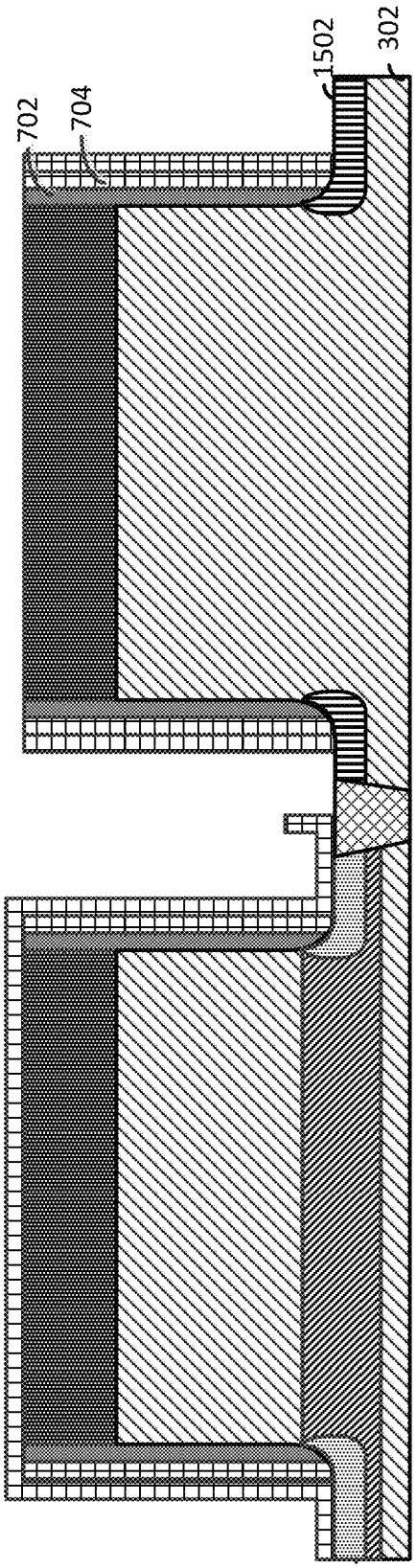

FIGS. 15A-15C illustrate cutaway views of the resultant structure following an epitaxial growth process that forms epitaxially grown (crystalline) semiconductor material 1502 on exposed portions of the substrate 302, in the cavity 1302 (of FIG. 14C) and the undercut region 1401 (of FIG. 14C). The epitaxially grown (crystalline) semiconductor material 1502 in the illustrated embodiment may include a different type of semiconductor material and/or different types of dopants than the epitaxially grown (crystalline) semiconductor material 1002 described above.

FIGS. 16A-16C illustrate cutaway views following the formation of a source/drain region 1602. The source/drain region 1602 is formed by, for example, an annealing process that drives dopants from the epitaxially grown semiconductor material 1502 into the underlying materials (i.e., portions of the fins 402b and the substrate 302). Since the dopants are driven from the epitaxially grown semiconductor material 1502, the source/drain region 1602 has a graduated doping concentration profile. Collectively, the epitaxially grown semiconductor material 1502 and the source/drain region 1602 define an active source/drain region or layer of the device 1601.

FIGS. 17A-17C illustrate cutaway views following the removal of the remaining portions of the liner layers 702 and 704 and the third liner layer 1202 (of FIG. 16C). The liner layers are removed by a suitable selective isotropic process such as, for example, a wet etch process.

FIGS. 18A-18C illustrate cutaway views of the resultant structure following the formation of a spacer (bottom spacer) 1802 over exposed portions of the source/drain layers 1101 and 1601. Non-limiting examples of suitable materials for the spacer 1802 include dielectric oxides (e.g., silicon oxide), dielectric nitrides (e.g., silicon nitride), dielectric oxynitrides, or any combination thereof. The layer of spacer material is deposited by a suitable deposition process, for example, chemical vapor deposition (CVD), atomic layer deposition (ALD), or physical vapor deposition (PVD). Following the deposition of the layer of spacer material, a suitable isotropic or anisotropic etching process such as, for example, a wet etch or a reactive ion etching process is performed to remove portions of the layer of spacer material and form the spacer 1802. The formation of the spacer 1802 forms cavities 1801 are partially defined by the spacer 1802, and the fins 402a and 402b.

FIGS. 19A-19C illustrate cutaway views of the resultant structure following the formation of metal gates (gate stacks) 1901a and 1901b and the spacer 1908 over the metal gates 1902. The metal gates 1901a and 1901b may include similar or dissimilar materials respectively.

The gate stacks 1902a and 1902b include high-k metal gates formed, for example, by filling the cavity 1801 (of FIG. 18C) with one or more dielectric materials 1902, one or more workfunction metals 1904, and one or more metal gate conductor materials 1906. The gate dielectric material(s) 1902 can be a dielectric material having a dielectric constant greater than 3.9, 7.0, or 10.0. Non-limiting examples of suitable materials for the dielectric materials 1902 include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum.

The gate dielectric materials 1902 may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the dielectric material may vary depending on the deposition process as well as the composition and number of high-k dielectric materials used. The dielectric material layer may have a thickness in a range from about 0.5 to about 20 nm.

The work function metal(s) 1904 may be disposed over the gate dielectric material 1902. The type of work function metal(s) 1904 depends on the type of transistor and may differ between the nFET and pFET devices. Non-limiting examples of suitable work function metals 1904 include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) may be deposited by a suitable deposition process, for example, CVD, PECVD, PVD, plating, thermal or e-beam evaporation, and sputtering.

The gate conductor material(s) 1906 is deposited over the gate dielectric materials 1902 and work function metal(s) 1904 to form the gate stacks 1902a and 1902b. Non-limiting examples of suitable conductive metals include aluminum (Al), platinum (Pt), gold (Au), tungsten (W), titanium (Ti), or any combination thereof. The gate conductor material(s) 1906 may be deposited by a suitable deposition process, for example, CVD, PECVD, PVD, plating, thermal or e-beam evaporation, and sputtering.

Following the deposition of the gate dielectric materials 1902, the work function metal(s) 1904, and the gate conductor material(s) 1906, planarization process, for example, chemical mechanical planarization (CMP), is performed to remove the overburden of the deposited gate materials and form the gate stacks 1902a and 1902b.

FIGS. 20A-24B illustrate an alternate exemplary method for fabricating another embodiment of a vertical FET device.

Figure 20A:
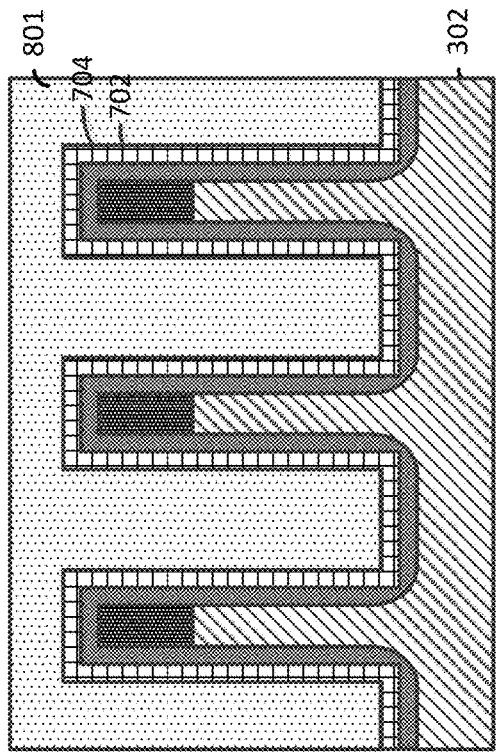
Figure 20B:
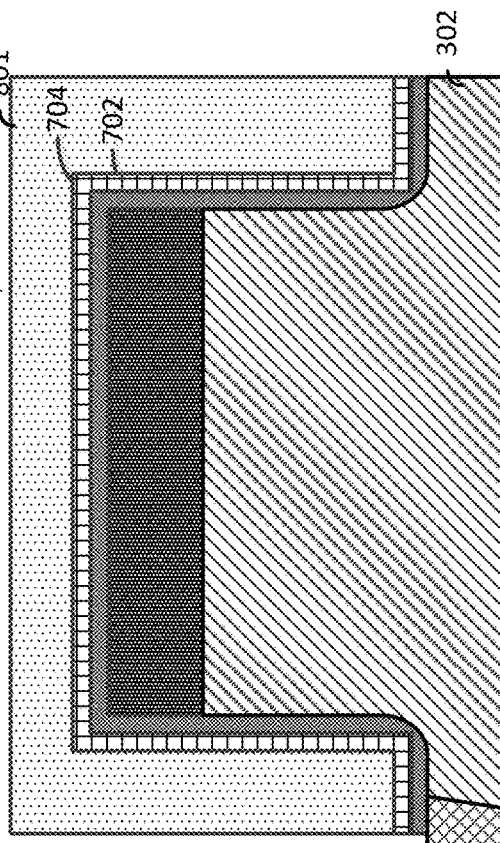
Figure 20C:
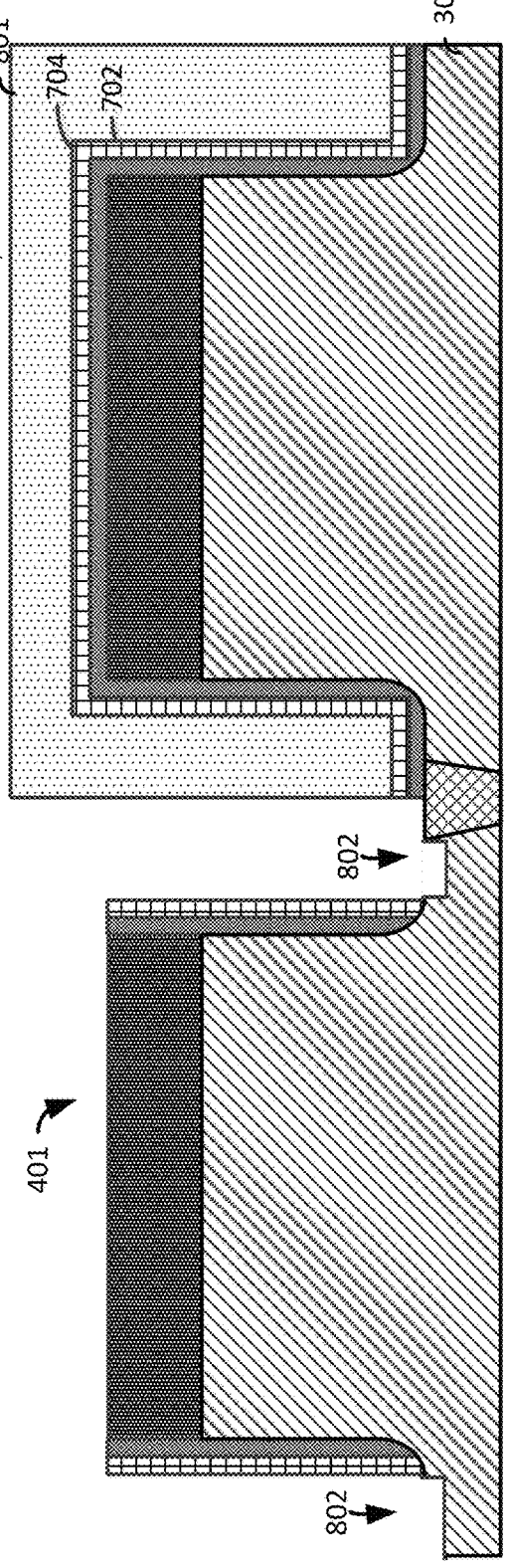

In this regard, FIGS. 20A-20C are similar to FIGS. 8A-8C respectively described above. In FIG. 20A, the cavity 802 has been formed in the substrate 302 using an anisotropic etching process.

FIGS. 21A-21C illustrate cut-away views of the resultant structure following an epitaxial growth process that forms epitaxially grown (crystalline) semiconductor material 2102 on exposed portions of the substrate 302 and in the cavity 802 (of FIG. 20C). The semiconductor material 2102. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor. The dopant concentration in the source/drain can range from $1\times10^{19}$ cm$^{-3}$ to $2\times10^{21}$ cm$^{-1}$, or preferably between $2\times10^{20}$ cm$^{-3}$ to $1\times10^{21}$ cm$^{-3}$. Prior to the epitaxial growth process the resist mask 801 (of FIG. 20C) was removed by a suitable process such as ashing.

FIGS. 22A-22C illustrate cut-away views following the formation of a source/drain region 2202. The source/drain region 2202 is formed by, for example, an annealing process that drives dopants from the epitaxially grown semiconductor material 2102 into the underlying materials (i.e., portions of the fins 402a and the substrate 302). Since the dopants are driven from the epitaxially grown semiconductor material 2101, the source/drain region 2202 has a graduated doping concentration profile. Collectively, the epitaxially grown semiconductor material 2102 and the source/drain region 2202 define an active source/drain region or layer 2201 of the device.

FIGS. 23A-23C illustrate cut-away views of the resultant structure following a selective isotropic etching process that removes exposed portions of the epitaxially grown semiconductor material 2102 to reduce the height of the epitaxially grown semiconductor material 2102.

FIGS. 24A-24C illustrate cut-away views of the resultant structure following the patterning of a second resist mask 1301 over the first semiconductor region 401 and an anisotropic etching process that removes exposed portions of the substrate 302 and forms the cavities 2402.

Figure 25A:
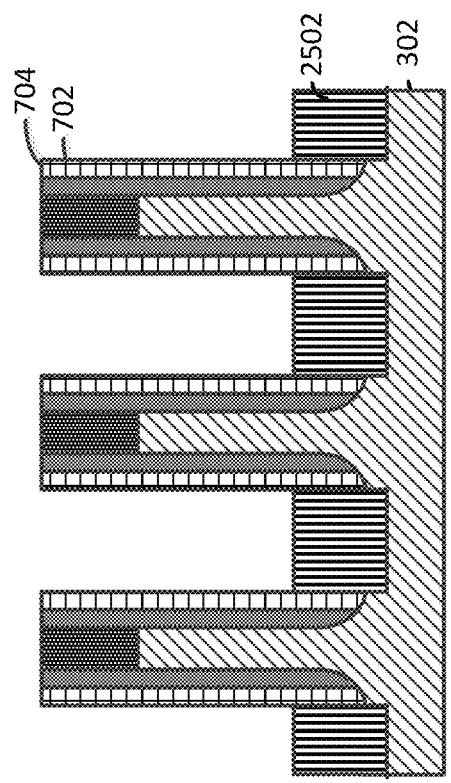
FIGS. 25A-25C illustrate cut-away views of the resultant structure following removal of patterned resist and an epitaxial growth process that forms doped epitaxially grown (crystalline) semiconductor material.
Figure 25B:
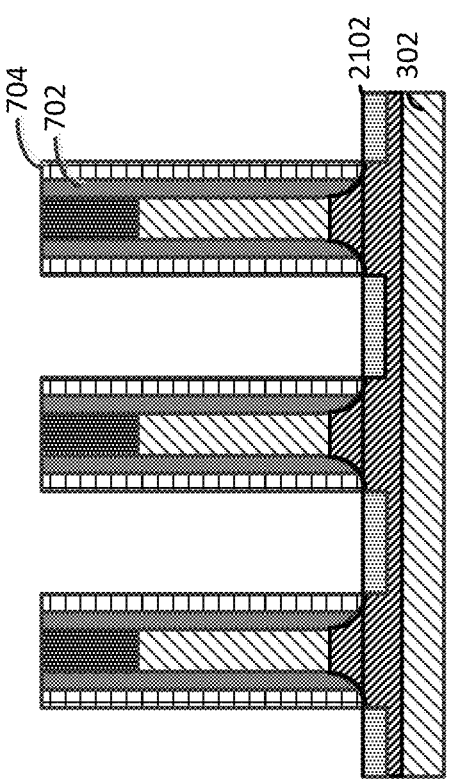
Figure 25C:
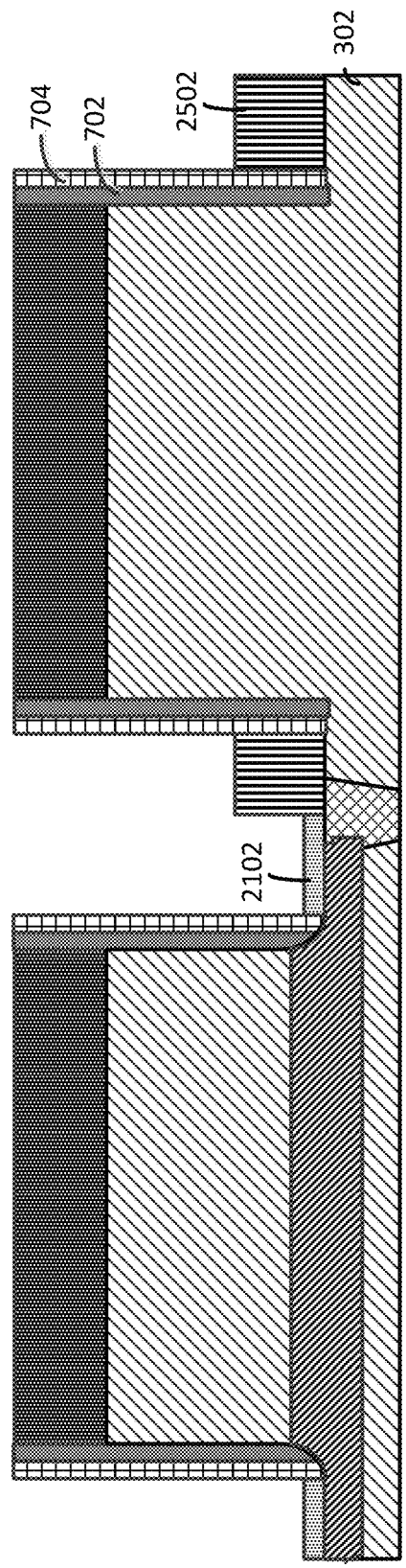

FIGS. 25A-25C illustrate cut-away views of the resultant structure following an epitaxial growth process that forms epitaxially grown (crystalline) semiconductor material 2502 on exposed portions of the substrate 302 and in the cavity 2402 (of FIG. 24C). The semiconductor material 2502. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor. The dopant concentration in the source/drain can range from $1\times10^{19}$ cm$^{-3}$ to $2\times10^{21}$ cm$^{-1}$, or preferably between $2\times10^{20}$ cm$^{-3}$ to $1\times10^{21}$ cm$^{-3}$. Prior to the epitaxial growth process the resist mask 2401 (of FIG. 24C) was removed by a suitable process such as ashing.

Figure 26A:
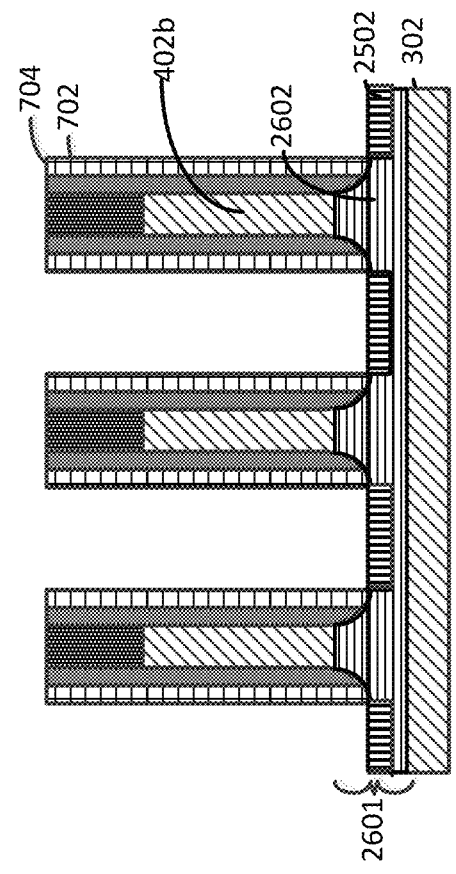
FIGS. 26A-26C illustrate cut-away views following the formation of a source/drain region.
Figure 26B:
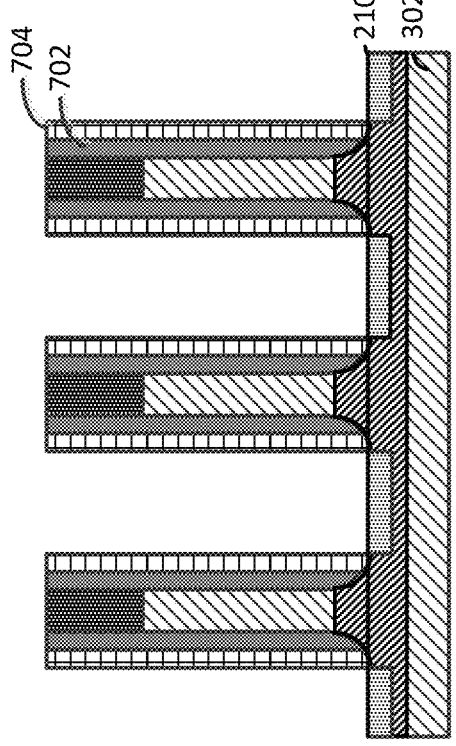
Figure 26C:
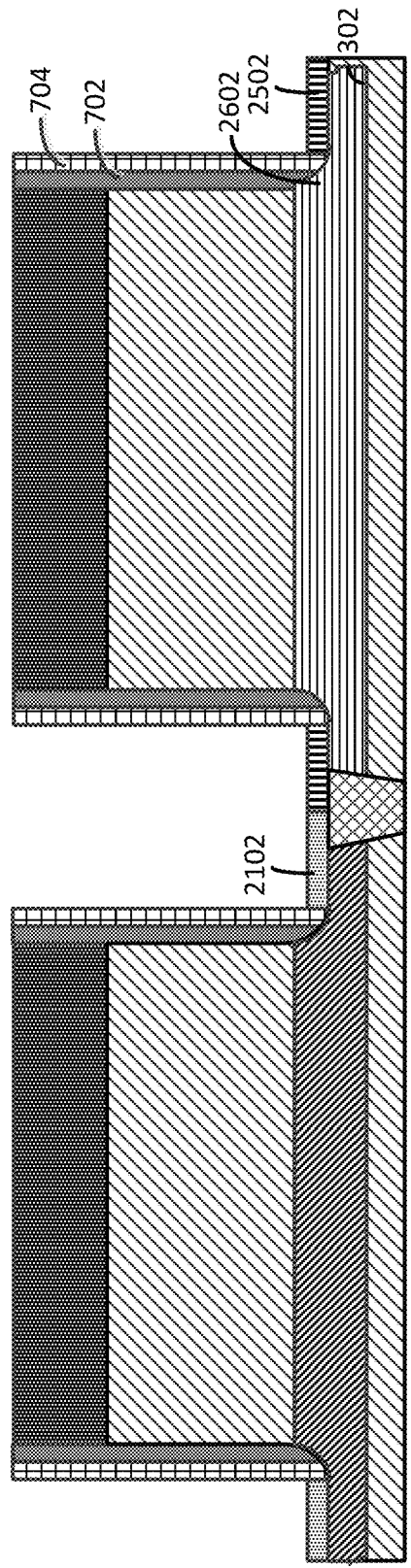

FIGS. 26A-26C illustrate cut-away views following the formation of a source/drain region 2602. The source/drain region 2602 is formed by, for example, an annealing process that drives dopants from the epitaxially grown semiconductor material 2502 into the underlying materials (i.e., portions of the fins 402b and the substrate 302). Since the dopants are driven from the epitaxially grown semiconductor material 2502, the source/drain region 2602 has a graduated doping concentration profile. Collectively, the epitaxially grown semiconductor material 2502 and the source/drain region 2602 define an active source/drain region or layer 2601 of the device.

FIGS. 27A-27C illustrate cutaway views following the removal of the remaining portions of the liner layers 702 and 704 (of FIG. 26C).

FIGS. 28A-28C illustrate cutaway views of the resultant structure following the formation of metal gates (gate stacks) 1901 and the spacer 1908 over the metal gates 1902.

As used herein, the terms "invention" or "present invention" are non-limiting terms and not intended to refer to any single aspect of the particular invention but encompass all possible aspects as described in the specification and the claims. The term "on" may refer to an element that is on, above or in contact with another element or feature described in the specification and/or illustrated in the figures.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for forming a semiconductor device, the method comprising:
    pattering a first fin in a semiconductor substrate comprising a semiconductor material, a hard mask cap arranged in direct contact with the semiconductor material of the first fin;
    forming a liner layer over the first fin and the semiconductor substrate, the first liner layer being a blanket layer that covers and directly contacts a top surface and vertical sidewalls of the fin, and covers and directly contacts the semiconductor substrate, the first liner layer including a single material that extends-continuously from the semiconductor substrate on one side of the first fin to the semiconductor substrate on an opposing side of the first fin;
    performing an anisotropic etching process on the liner layer such that the hard mask cap on the first fin and a first portion of the semiconductor substrate adjacent to the first fin are exposed, and the liner layer remains along the substantially vertical sidewalls of the first fin;
    removing a portion of the exposed semiconductor substrate to form a first cavity;
    performing an isotropic etching process to remove portions of the semiconductor substrate in the first cavity and form a first undercut region below the liner layer;
    growing a first epitaxial semiconductor material in the first undercut region and the first cavity; and
    performing a first annealing process to drive dopants from the first epitaxial semiconductor material into the first fin to form a first source/drain layer directly vertically beneath the first fin and in portions of the semiconductor substrate.

2. The method of claim 1, further comprising:
    patterning a second fin in the semiconductor substrate;
    forming the liner layer over the second fin; and
    forming a first mask over the second fin and the liner layer prior to removing the first portion of the liner layer to expose a first portion of the semiconductor substrate adjacent to the first fin.

3. The method of claim 2, further comprising removing the first mask after removing the first portion of the liner layer to expose a first portion of the semiconductor substrate adjacent to the first fin.

4. The method of claim 3, further comprising;
    forming a second liner layer over the first fin and the second fin after performing the first annealing process;
    forming a second mask over the first fin;
    removing a second portion of the liner layer to expose a second portion of the semiconductor substrate adjacent to the second fin;
    removing a portion of the exposed semiconductor substrate to form a second cavity;
    performing an isotropic etching process to remove portions of the semiconductor substrate in the second cavity and form a second undercut region below the liner layer and the second liner layer;
    growing a second epitaxial semiconductor material in the second undercut region and the second cavity; and
    performing a second annealing process to drive dopants from the second epitaxial semiconductor material into the second fin to form a second source/drain layer under the second fin and in portions of the semiconductor substrate.

5. The method of claim 1, further comprising:
    forming a first spacer layer over the first source/drain layer;
    forming a gate stack over the first spacer layer; and
    forming a second spacer layer over the gate stack.

6. The method of claim 4, further comprising:
    forming the first spacer layer over the second source/drain layer;
    forming a gate stack over the first spacer layer; and
    forming a second spacer layer over the gate stack.

7. The method of claim 4, wherein the first epitaxial semiconductor material is dissimilar from the second epitaxial semiconductor material.

8. The method of claim 1, wherein the first source/drain region has a graduated concentration of dopants.

9. The method of claim 4, wherein the second source/drain region has a graduated concentration of dopants.

10. A method for forming a semiconductor device, the method comprising;
    patterning a first fin in a semiconductor substrate comprising a semiconductor material, a hard mask cap arranged in direct contact with the semiconductor material of the first fin;
    forming a liner layer over the first fin and the semiconductor substrate, the first liner layer being a blanket layer that covers and directly contacts a top surface and vertical sidewalls of the fin, and covers and directly contacts the semiconductor substrate, the first liner layer including a single material extends-continuously from the semiconductor substrate on one side of the first fin to the semiconductor substrate on an opposing side of the first fin;
    performing an anisotropic etching process on the liner layer such that the hard mask cap on the first fin and a first portion of the semiconductor substrate adjacent to the first fin are exposed, and the liner layer remains along the substantially vertical sidewalls of the first fin;
    removing a portion of the exposed semiconductor substrate to form a first cavity;

growing a first epitaxial semiconductor material in the first cavity; and performing a first annealing process to drive dopants from the first epitaxial semiconductor material into the first fin to form a first source/drain layer under the first fin and in portions of the semiconductor substrate.

11. The method of claim 10, further comprising:
patterning a second fin in the semiconductor substrate;
forming the liner layer over the second fin; and
forming a first mask over the second fin and the liner layer prior to removing the first portion of the liner layer to expose a first portion of the semiconductor substrate adjacent to the first fin.

12. The method of claim 11, further comprising removing the first mask after removing the first portion of the liner layer to expose a first portion of the semiconductor substrate adjacent to the first fin.

13. The method of claim 12, further comprising:
forming a second mask over the first fin;
removing a second portion of the liner layer to expose a second portion of the semiconductor substrate adjacent to the second fin;
removing a portion of the exposed semiconductor substrate to form a second cavity;
growing a second epitaxial semiconductor material in the second cavity; and performing a second annealing process to drive dopants from the second epitaxial semiconductor material into the second fin to form a second source/drain layer under the second fin and in portions of the semiconductor substrate.

14. The method of claim 10, further comprising:
forming a first spacer layer over the first source/drain layer;
forming a gate stack over the first spacer layer; and
forming a second spacer layer over the gate stack.

15. The method of claim 14, further comprising:
forming the first spacer layer over the second source/drain layer;
forming a gate stack over the first spacer layer; and
forming a second spacer layer over the gate stack.

16. The method of claim 13, wherein the first epitaxial semiconductor material is dissimilar from the second epitaxial semiconductor material.

17. The method of claim 10, wherein the first source/drain region has a graduated concentration of dopants.

18. The method of claim 13, wherein the second source/drain region has a graduated concentration of dopants.

19. The method of claim 13, wherein the first spacer layer includes a nitride material.

20. The method of claim 13, wherein the second spacer layer includes a nitride material.

* * * * *